(12) United States Patent
Lee et al.

(10) Patent No.: US 11,393,909 B2
(45) Date of Patent: Jul. 19, 2022

(54) SEMICONDUCTOR DEVICES INLCUDING A FIN FIELD EFFECT TRANSISTOR

(71) Applicant: Samsung Electronics Co., Ltd., Suwon-si (KR)

(72) Inventors: Doohyun Lee, Hwaseong-si (KR); Hyun-Seung Song, Hwaseong-si (KR); Yeongchang Roh, Gwangju (KR); Heonjong Shin, Yongin-si (KR); Sora You, Cheonan-si (KR); Yongsik Jeong, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/514,070

(22) Filed: Jul. 17, 2019

(65) Prior Publication Data
US 2020/0119150 A1  Apr. 16, 2020

(30) Foreign Application Priority Data

Oct. 15, 2018  (KR) .......................... 10-2018-0122554

(51) Int. Cl.
| | | |
|---|---|---|
| *H01L 23/535* | (2006.01) | |
| *H01L 29/08* | (2006.01) | |
| *H01L 29/423* | (2006.01) | |
| *H01L 23/532* | (2006.01) | |
| *H01L 29/417* | (2006.01) | |

(Continued)

(52) U.S. Cl.
CPC ...... *H01L 29/41775* (2013.01); *H01L 23/535* (2013.01); *H01L 23/53209* (2013.01); *H01L 29/0847* (2013.01); *H01L 29/41791* (2013.01); *H01L 29/42376* (2013.01); *H01L 29/4958* (2013.01); *H01L 29/4966* (2013.01);
(Continued)

(58) Field of Classification Search
CPC .......... H01L 29/0847; H01L 29/41725; H01L 29/41775; H01L 29/41791; H01L 29/42376; H01L 29/45; H01L 29/456; H01L 29/4958; H01L 29/4966; H01L 29/66575; H01L 29/66636; H01L 29/66795; H01L 29/785; H01L 21/28079; H01L 21/28088; H01L 21/7684; H01L 21/76807; H01L 21/76841; H01L 21/76843; H01L 21/76877; H01L 21/76895; H01L 23/53209; H01L 23/535
See application file for complete search history.

(56) References Cited

U.S. PATENT DOCUMENTS

| | | | |
|---|---|---|---|
| 6,706,594 B2 * | 3/2004 | Hurley | .................. H01L 27/115 257/314 |
| 7,573,084 B2 | 8/2009 | Kumura et al. | |

(Continued)

FOREIGN PATENT DOCUMENTS

| | | |
|---|---|---|
| KR | 10-1998-0011890 | 4/1998 |
| KR | 10-2000-0052111 | 8/2000 |

*Primary Examiner* — Maliheh Malek
(74) *Attorney, Agent, or Firm* — Myers Bigel, P.A.

(57) ABSTRACT

A semiconductor device comprising a gate electrode on a substrate, a source/drain pattern on the substrate on a side of the gate electrode, and a gate contact plug on the gate electrode are disclosed. The gate contact plug may include a first gate contact segment, and a second gate contact segment that extends in a vertical direction from a top surface of the first gate contact segment. An upper width of the first gate contact segment may be greater than a lower width of the second gate contact segment.

18 Claims, 34 Drawing Sheets

(51) Int. Cl.
*H01L 29/49* (2006.01)
*H01L 21/28* (2006.01)
*H01L 29/45* (2006.01)

(52) U.S. Cl.
CPC .. *H01L 21/28079* (2013.01); *H01L 21/28088* (2013.01); *H01L 29/456* (2013.01)

(56) References Cited

U.S. PATENT DOCUMENTS

| | | | |
|---|---|---|---|
| 7,675,125 B2* | 3/2010 | Park | H01L 27/11529 257/390 |
| 7,825,472 B2* | 11/2010 | Park | H01L 27/0688 257/351 |
| 8,492,228 B1* | 7/2013 | Leobandung | H01L 21/823431 438/275 |
| 9,054,172 B2* | 6/2015 | Hung | H01L 21/32115 |
| 9,059,253 B2* | 6/2015 | Cheng | H01L 29/51 |
| 9,324,656 B1* | 4/2016 | Labonte | H01L 21/76897 |
| 9,490,317 B1* | 11/2016 | Labonte | H01L 21/76897 |
| 9,496,488 B2* | 11/2016 | Kwon | H01L 27/228 |
| 9,508,825 B1* | 11/2016 | Basker | H01L 29/66545 |
| 9,660,041 B2 | 5/2017 | Song et al. | |
| 10,049,929 B2* | 8/2018 | Hung | H01L 29/78 |
| 10,062,762 B2* | 8/2018 | Liu | H01L 29/66795 |
| 10,115,806 B2* | 10/2018 | Kim | H01L 29/41791 |
| 10,128,149 B2* | 11/2018 | Kansaku | H01L 21/02244 |
| 10,141,225 B2* | 11/2018 | Tsai | H01L 21/28088 |
| 10,256,296 B2* | 4/2019 | Ok | H01L 29/4975 |
| 10,388,770 B1* | 8/2019 | Xie | H01L 29/41791 |
| 10,510,596 B2* | 12/2019 | Tsai | H01L 21/7684 |
| 10,686,069 B2* | 6/2020 | Kim | H01L 29/66666 |
| 10,872,980 B2* | 12/2020 | Tsai | H01L 21/76897 |
| 11,251,305 B2* | 2/2022 | Huang | H01L 29/7851 |
| 11,282,705 B2* | 3/2022 | Chiang | H01L 29/66795 |
| 2003/0013253 A1* | 1/2003 | Hurley | H01L 27/115 438/257 |
| 2008/0079091 A1* | 4/2008 | Park | H01L 27/115 257/390 |
| 2011/0006360 A1* | 1/2011 | Ikebuchi | H01L 27/10894 257/329 |
| 2011/0053369 A1* | 3/2011 | Jang | H01L 21/76804 438/652 |
| 2012/0037962 A1* | 2/2012 | Breyta | H01L 23/4821 257/288 |
| 2012/0043592 A1* | 2/2012 | Zhao | H01L 21/76847 257/288 |
| 2012/0104471 A1* | 5/2012 | Chang | H01L 21/76838 257/288 |
| 2013/0285125 A1* | 10/2013 | Chen | H01L 24/13 257/288 |
| 2014/0027822 A1* | 1/2014 | Su | H01L 21/76895 257/288 |
| 2014/0199837 A1* | 7/2014 | Hung | H01L 23/485 438/675 |
| 2014/0254239 A1* | 9/2014 | Song | H01L 21/823437 365/148 |
| 2015/0035046 A1* | 2/2015 | Kim | H01L 27/0886 257/327 |
| 2015/0214341 A1* | 7/2015 | Shin | H01L 29/7851 257/401 |
| 2015/0279734 A1* | 10/2015 | Chowdhury | H01L 21/76816 438/675 |
| 2015/0364427 A1* | 12/2015 | Kansaku | H01L 21/28568 257/751 |
| 2016/0005851 A1* | 1/2016 | Song | H01L 27/0207 257/401 |
| 2016/0020303 A1* | 1/2016 | Jun | H01L 21/31144 438/299 |
| 2016/0035623 A1* | 2/2016 | Shao | H01L 23/485 257/774 |
| 2016/0079259 A1* | 3/2016 | Son | H01L 27/11582 257/401 |
| 2016/0111524 A1* | 4/2016 | Ha | H01L 27/0886 438/283 |
| 2016/0141207 A1* | 5/2016 | Hung | H01L 23/528 438/286 |
| 2016/0163644 A1* | 6/2016 | Woo | H01L 21/28518 257/401 |
| 2016/0172357 A1* | 6/2016 | Song | H01L 21/76895 257/401 |
| 2016/0284697 A1* | 9/2016 | Yoon | H01L 29/4238 |
| 2016/0284806 A1* | 9/2016 | Park | H01L 29/51 |
| 2016/0293749 A1* | 10/2016 | Park | H01L 29/41791 |
| 2016/0307890 A1* | 10/2016 | Yeo | H01L 29/66795 |
| 2016/0343709 A1* | 11/2016 | Kim | H01L 29/0653 |
| 2017/0005005 A1* | 1/2017 | Chen | H01L 21/823431 |
| 2017/0117411 A1* | 4/2017 | Kim | H01L 21/823821 |
| 2018/0033866 A1* | 2/2018 | Liao | H01L 21/32137 |
| 2018/0040510 A1 | 2/2018 | Briggs et al. | |
| 2018/0040814 A1* | 2/2018 | Park | H01L 27/228 |
| 2018/0096935 A1* | 4/2018 | Kim | H01L 23/535 |
| 2018/0130796 A1* | 5/2018 | Jun | H01L 29/0696 |
| 2018/0151427 A1* | 5/2018 | Chung | H01L 23/535 |
| 2018/0182856 A1* | 6/2018 | Lee | H01L 21/76849 |
| 2018/0308797 A1* | 10/2018 | Tsai | H01L 29/41766 |
| 2018/0358293 A1* | 12/2018 | Hong | H01L 23/485 |
| 2018/0358374 A1* | 12/2018 | Kim | H01L 29/1037 |
| 2019/0103311 A1* | 4/2019 | Tsai | H01L 21/7684 |
| 2019/0157406 A1* | 5/2019 | Hwang | H01L 21/28518 |
| 2019/0165176 A1* | 5/2019 | Wang | H01L 29/456 |
| 2019/0259855 A1* | 8/2019 | Cheng | H01L 21/76831 |
| 2019/0296124 A1* | 9/2019 | Hsu | H01L 21/31105 |
| 2019/0363180 A1* | 11/2019 | Zang | H01L 29/41791 |
| 2019/0378926 A1* | 12/2019 | Song | H01L 29/66666 |
| 2019/0393321 A1* | 12/2019 | Xu | H01L 29/6656 |
| 2020/0027870 A1* | 1/2020 | Ha | H01L 21/823864 |
| 2020/0075595 A1* | 3/2020 | Shin | H01L 29/6681 |
| 2020/0091064 A1* | 3/2020 | Iwasaki | H01L 27/11575 |
| 2020/0098786 A1* | 3/2020 | Park | H01L 29/4234 |
| 2020/0185524 A1* | 6/2020 | Paak | H01L 23/485 |
| 2020/0395536 A1* | 12/2020 | Kim | H01L 43/02 |
| 2021/0035971 A1* | 2/2021 | Park | H01L 29/7851 |
| 2021/0057536 A1* | 2/2021 | Lee | H01L 29/78696 |
| 2021/0082757 A1* | 3/2021 | Lee | H01L 23/5283 |
| 2021/0082770 A1* | 3/2021 | Xie | H01L 21/823431 |
| 2021/0098366 A1* | 4/2021 | Chang | H01L 23/5226 |
| 2021/0217861 A1* | 7/2021 | Song | H01L 29/41775 |
| 2021/0233860 A1* | 7/2021 | Bark | H01L 21/76802 |
| 2021/0272893 A1* | 9/2021 | Song | H01L 23/5222 |
| 2021/0375722 A1* | 12/2021 | Kim | H01L 29/0649 |
| 2022/0077292 A1* | 3/2022 | Bae | H01L 29/41775 |
| 2022/0085031 A1* | 3/2022 | Wu | H01L 27/10876 |
| 2022/0085179 A1* | 3/2022 | Kim | H01L 29/42392 |

* cited by examiner

US 11,393,909 B2

SEMICONDUCTOR DEVICES INLCUDING A FIN FIELD EFFECT TRANSISTOR

CROSS-REFERENCE TO RELATED APPLICATION

This U.S. nonprovisional application claims priority under 35 U.S.C § 119 to Korean Patent Application No. 10-2018-0122554 filed on Oct. 15, 2018 in the Korean Intellectual Property Office, the entire contents of which are hereby incorporated by reference.

TECHNICAL FIELD

The present inventive concepts relate to semiconductor devices, and more particularly, to semiconductor devices including a fin field effect transistor.

BACKGROUND

Semiconductor devices are beneficial in electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of electronic industry. For example, semiconductor devices having increased reliability, increased speed, and/or multi-functionality have been increasingly requested. Semiconductor devices have become more gradually complicated and integrated to meet these requested characteristics.

SUMMARY

Some example embodiments of the present inventive concepts provide semiconductor devices with improved reliability. The present disclosure is not limited to this objective, and other objectives of the present inventive concepts will be clearly understood to those skilled in the art from the following description.

According to some example embodiments of the present inventive concepts, a Semiconductor device may comprise: a gate electrode on a substrate; a source/drain pattern on the substrate spaced apart from the gate electrode; and a gate contact plug on the gate electrode. The gate contact plug may comprise: a first gate contact segment; and a second gate contact segment that extends in a vertical direction from a top surface of the first gate contact segment. An upper width of the first gate contact segment may be greater than a lower width of the second gate contact segment.

According to some example embodiments of the present inventive concepts, a semiconductor device may comprise: a gate electrode on a substrate; a source/drain pattern on the substrate spaced apart from the gate electrode; and a gate contact plug on the gate electrode. The gate contact plug may comprise: a first metal plug on the gate electrode; and a first barrier pattern that covers a sidewall of the first metal plug. The first metal plug may comprise a first upper part exposed by the first barrier pattern and a first lower part covered with the first barrier pattern.

According to some example embodiments of the present inventive concepts, a semiconductor device may comprise: an active fin that protrudes vertically from a top surface of a substrate; a gate pattern extending across the active fin; a source/drain pattern on the substrate and spaced apart from the gate pattern; and a gate contact plug on the gate pattern. The gate contact plug may comprise: a first gate contact segment; and a second gate contact segment that extends vertically from a top surface of the first gate contact segment. An upper width of the first gate contact segment may be greater than a lower width of the second gate contact segment.

BRIEF DESCRIPTION OF THE DRAWINGS

FIGS. 6A to 12A illustrate cross-sectional views taken along line I-I' of FIG. 1, showing a method of fabricating a semiconductor device according to some example embodiments of the present inventive concepts.

FIGS. 6B to 12B illustrate cross-sectional views taken along line II-II' of FIG. 1, showing a method of fabricating a semiconductor memory device according to some example embodiments of the present inventive concepts.

FIGS. 6C to 12C illustrate cross-sectional views taken along line III-III' of FIG. 1, showing a method of fabricating a semiconductor device according to some example embodiments of the present inventive concepts.

DETAILED DESCRIPTION

Figure 1:
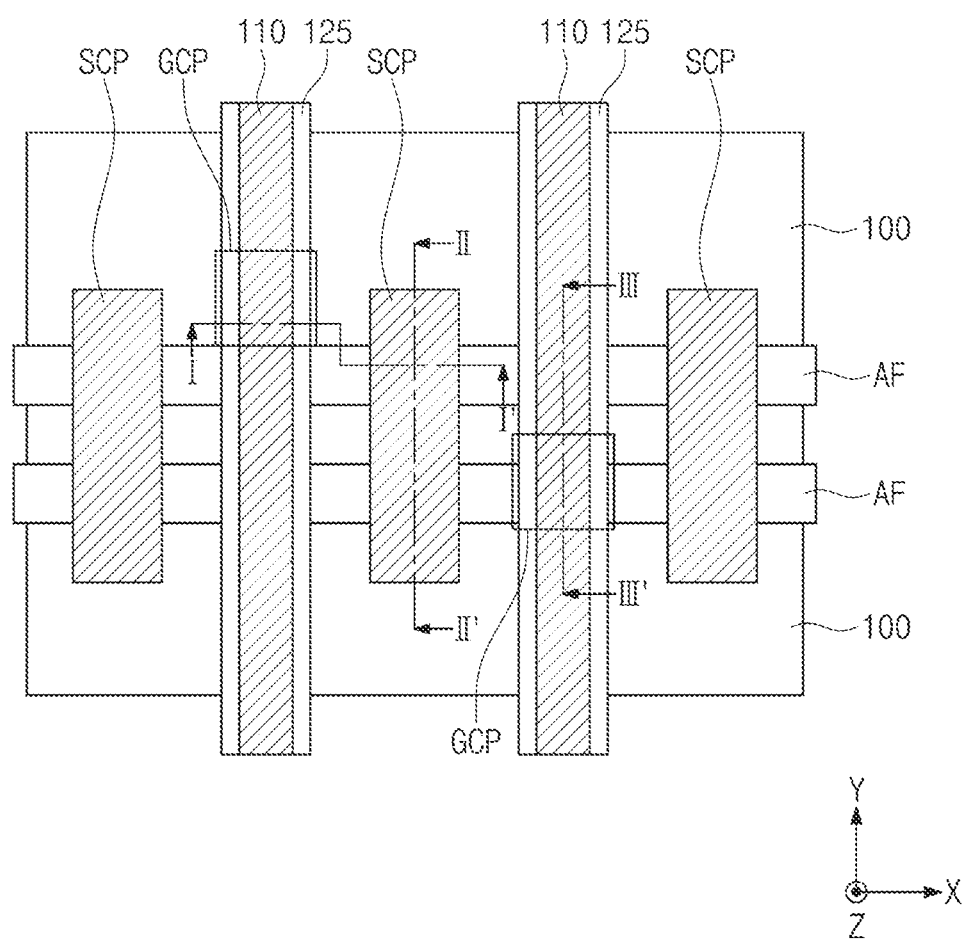
FIG. 1 illustrates a plan view showing a semiconductor device according to some example embodiments of the present inventive concepts.
Figure 2A:
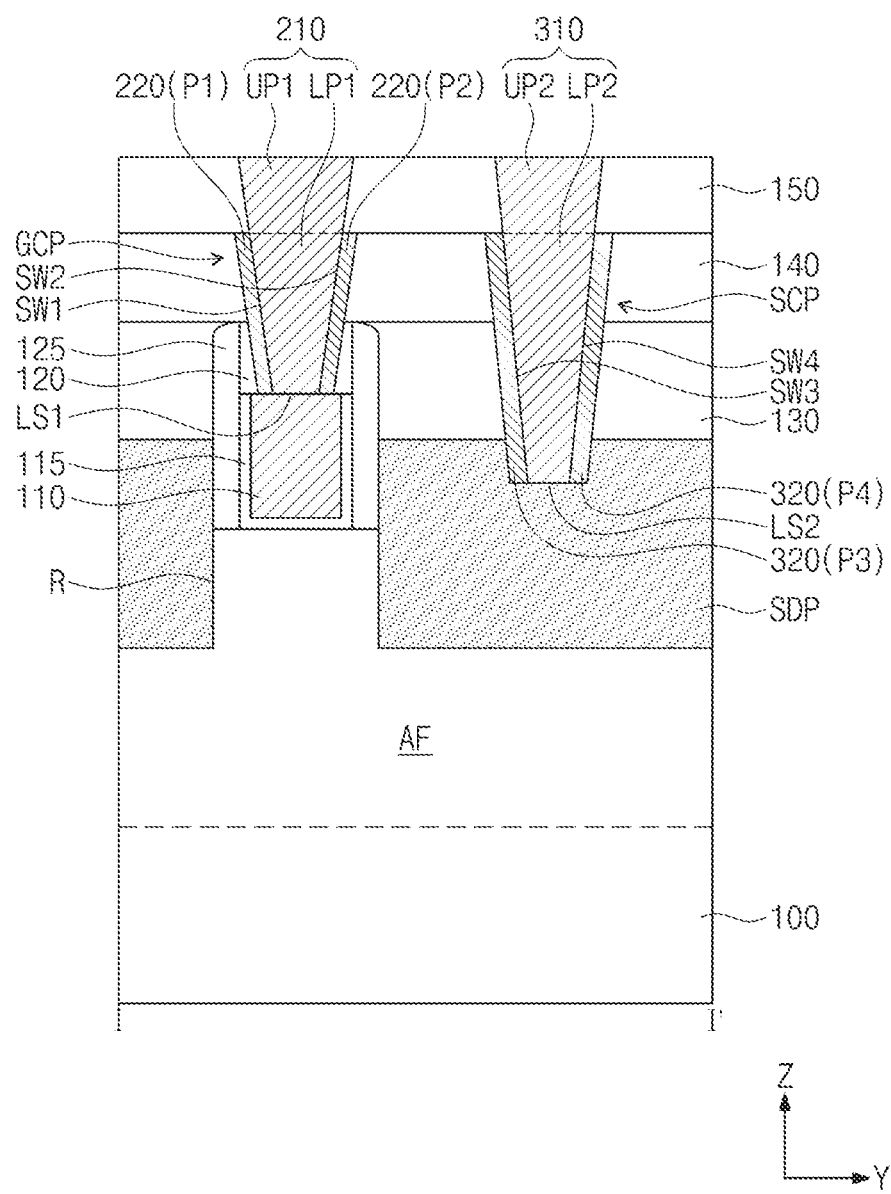
FIG. 2A illustrates a cross-sectional view taken along line I-I' of FIG. 1, showing a semiconductor device according to some example embodiments of the present inventive concepts.
Figure 2B:
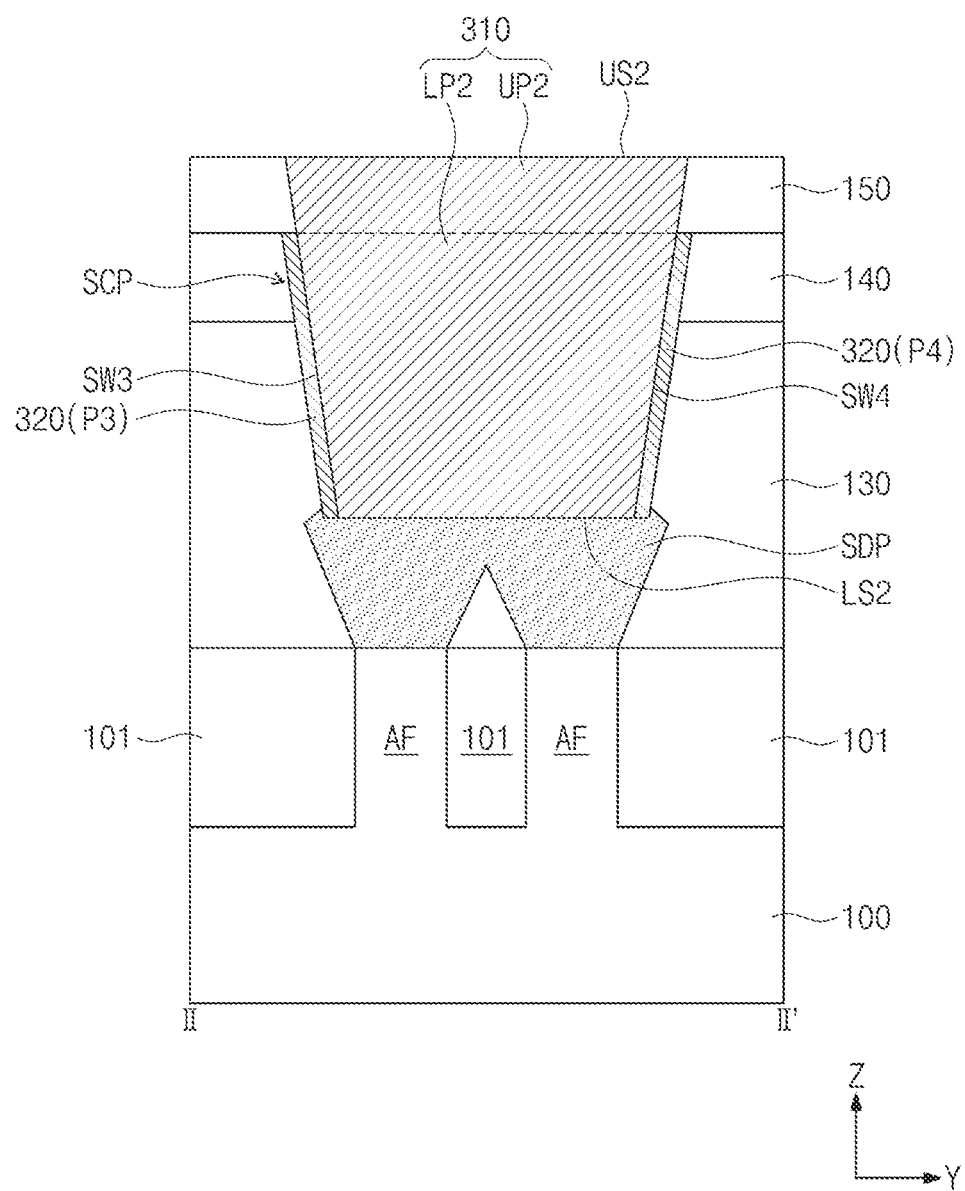
FIG. 2B illustrates a cross-sectional view taken along line II-II' of FIG. 1, showing a semiconductor device according to some example embodiments of the present inventive concepts.
Figure 2C:
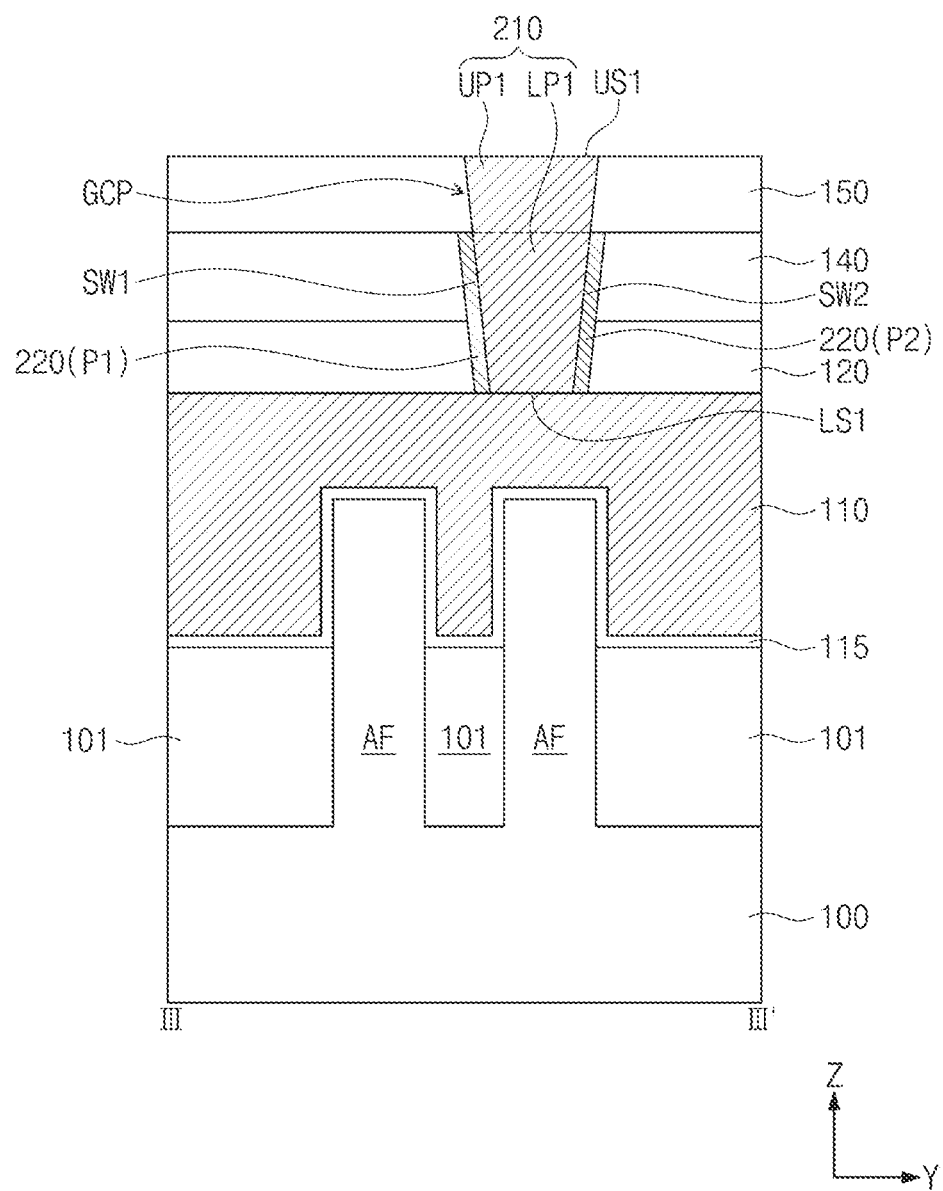
FIG. 2C illustrates a cross-sectional view taken along line III-III' of FIG. 1, showing a semiconductor device according to some example embodiments of the present inventive concepts.

FIG. 1 illustrates a plan view showing a semiconductor device according to some example embodiments of the present inventive concepts. FIG. 2A illustrates a cross-sectional view taken along line I-I' of FIG. 1, showing a semiconductor device according to some example embodiments of the present inventive concepts. FIG. 2B illustrates a cross-sectional view taken along line II-II' of FIG. 1, showing a semiconductor device according to some example embodiments of the present inventive concepts. FIG. 2C illustrates a cross-sectional view taken along line III-III' of FIG. 1, showing a semiconductor device according to some example embodiments of the present inventive concepts.

Referring to FIGS. 1 and 2A to 2C, an active fin AF may protrude in a third direction Z from a top surface of a substrate 100. The third direction Z may be perpendicular to the top surface of the substrate 100. The active fin AF may extend in a first direction X. A device isolation layer 101 may be on the substrate 100 on a side of the active fin AF. The device isolation layer 101 may define the active fin AF. The device isolation layer 101 may have a top surface at a level equal to or higher than that of a top surface of the active fin AF. The substrate 100 may be a single crystalline silicon wafer or a silicon-on-insulator (SOI) substrate. The device isolation layer 101 may include a single or multiple layer consisting of one or more of a silicon oxide layer, a silicon nitride layer, and a silicon oxynitride layer.

A gate electrode 110 may run across the active fin AF. The gate electrode 110 may extend in a second direction Y intersecting the first direction X. The gate electrode 110 may cover the top surface and sidewalls of the active fin AF. The gate electrode 110 may include a work function pattern and a metal pattern. The work function pattern may be an N-type work function pattern or a P-type work function pattern. The N-type work function pattern may include one or more of lanthanum (La), lanthanum oxide (LaO), tantalum (Ta), tantalum nitride (TaN), niobium (Nb), and titanium nitride (TiN). The P-type work function pattern may include one or more of aluminum (Al), aluminum oxide ($Al_2O_3$), titanium nitride (TiN), tungsten nitride (WN), and ruthenium oxide ($RuO_2$). The metal pattern may include one or more of tungsten, copper, and aluminum.

A gate dielectric layer 115 may be interposed between the gate electrode 110 and the active fin AF. As best seen in FIG. 2C, the gate dielectric layer 115 may cover the top surface and the sidewalls of the active fin AF overlapped with the gate electrode 110 and also cover a top surface of the device isolation layer 101. As best seen in FIG. 2A, the gate dielectric layer 115 may extend onto a sidewall of the gate electrode 110. The gate dielectric layer 115 may extend in the second direction Y along a sidewall of the gate electrode 110. The gate dielectric layer 115 may include, for example, a thermal oxide layer, a silicon oxide layer, or a high-k dielectric layer. The high-k dielectric layer may be formed of a material including one or more of hafnium oxide ($HfO_2$), hafnium silicate (HfSiO), hafnium oxynitride (HfON), hafnium silicon oxynitride (HfSiON), hafnium aluminum oxide ($HfAlO_3$), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), titanium oxide ($TiO_2$), barium strontium titanium oxide (BaSrTiO), barium titanium oxide (Ba-TiO), strontium titanium oxide (SrTiO), yttrium oxide (YO), aluminum oxide ($Al_2O_3$), tantalum oxide ($Ta_2O_3$), and lead scandium tantalum oxide (PbScTaO).

A gate capping pattern 120 may be on a top surface of the gate electrode 110 and a top surface of the gate dielectric layer 115. The gate capping pattern 120 may extend in the second direction Y on the top surface of the gate electrode 110. The gate capping pattern 120 may have a sidewall aligned with an outer sidewall of the gate dielectric layer 115 extending along the sidewall of the gate electrode 110. The gate capping pattern 120 may have a top surface whose width in the first direction X is less than a width in the first direction X of a top surface of the dielectric layer 115. The gate capping pattern 120 may include, for example, a silicon nitride layer. A spacer 125 may be on the sidewall of the gate electrode 110 and the sidewall of the gate capping pattern 120. The spacer 125 may cover a sidewall of the gate dielectric layer 115 covering the sidewall of the gate electrode 110. The spacer 125 may extend in the second direction Y along the sidewall of the gate electrode 110. The spacer 125 may include a single or multiple layer consisting of, for example, a silicon oxide layer, a silicon nitride layer, and a silicon oxynitride layer. The gate electrode 110, the gate dielectric layer 115, the gate capping pattern 120, and the spacer 125 may extend across a plurality of active fins AF.

A source/drain pattern SDP may be on the active fin AF on a side of the gate electrode 110. The active fin AF on the side of the gate electrode 110 may include a recess region R having a bottom surface at a lower level than that of the top surface of the active fin AF below the gate electrode 110. The source/drain pattern SDP may be in the recess region R. The source/drain pattern SDP may run across a plurality of active fins AF arranged in the second direction Y (e.g., the plurality of active fins AF may be spaced apart from each other in the second direction Y). The source/drain pattern SDP may extend in the second direction Y. The source/drain pattern SDP may be an epitaxial layer whose material is the same as that of the substrate 100. The source/drain pattern SDP may be a silicon epitaxial layer or a silicon-germanium epitaxial layer. The source/drain pattern SDP may be doped with N-type or P-type impurities. The source/drain pattern SDP may include silicon carbide. In certain embodiments, a semiconductor device including the gate electrode 110 and the source/drain pattern SDP may be an NMOSFET or a PMOSFET.

A first interlayer dielectric layer 130 may be on the source/drain pattern SDP. The first interlayer dielectric layer 130 may cover the top surface of the device isolation layer 101 and also cover top and lateral surfaces of the source/drain pattern SDP. The first interlayer dielectric layer 130 may have a top surface at the same level as that of the top surfaces of the gate capping pattern 120. The first interlayer dielectric layer 130 may include a single or multiple layer consisting of, for example, a silicon oxide layer, a silicon nitride layer, a silicon oxynitride layer, and a porous dielectric layer.

A second interlayer dielectric layer 140 and a third interlayer dielectric layer 150 may be sequentially on the first interlayer dielectric layer 130 and the gate capping pattern 120. The second interlayer dielectric layer 140 may be on the top surface of the gate capping pattern 120 and the top surface of the first interlayer dielectric layer 130. The third interlayer dielectric layer 150 may be on a top surface of the second interlayer dielectric layer 140. The second interlayer dielectric layer 140 and the third interlayer dielectric layer 150 may include a single or multiple layer consisting of, for example, a silicon oxide layer, a silicon nitride layer, a silicon oxynitride layer, and a porous dielectric layer.

Figure 2D:
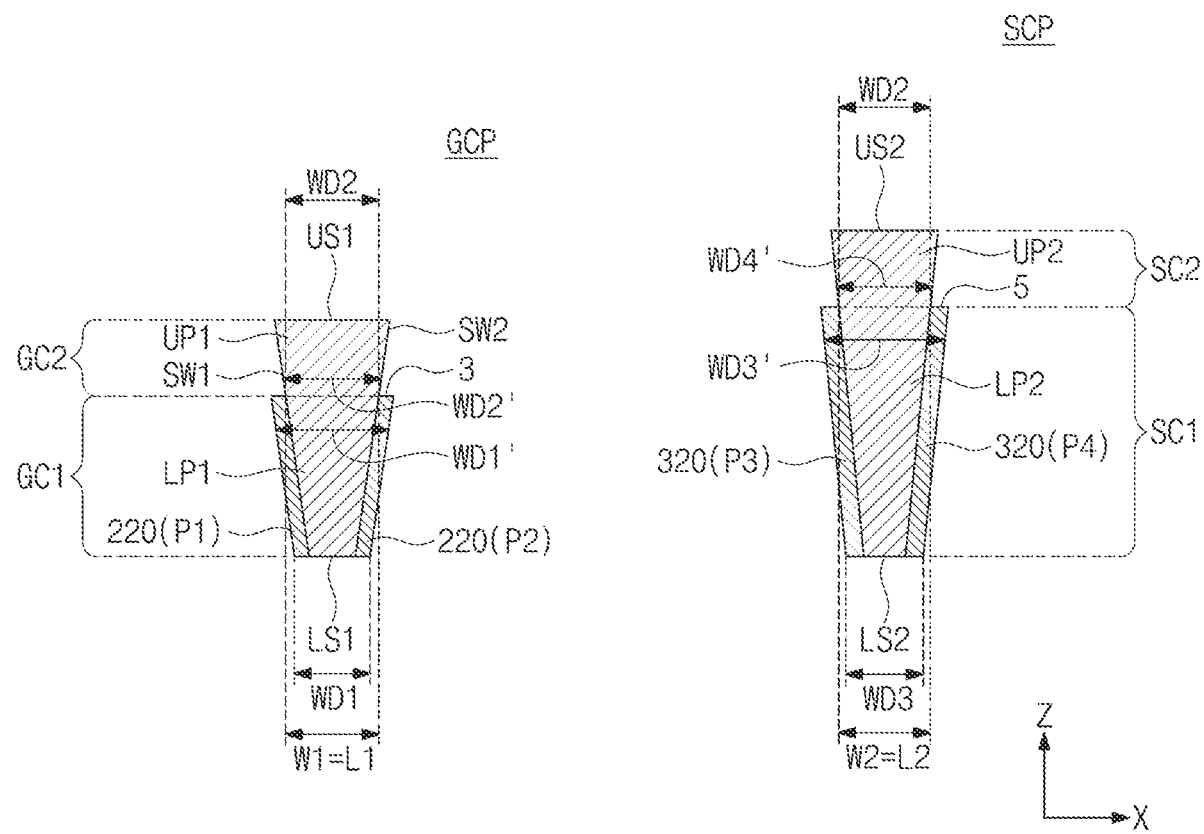
FIG. 2D illustrates an enlarged cross-sectional view showing a gate contact plug and a source/drain contact plug according to some example embodiments of the present inventive concepts.

Referring now to FIG. 2D, a gate contact plug GCP may be on the gate electrode 110. The gate contact plug GCP may penetrate the gate capping pattern 120, the second interlayer dielectric layer 140, and the third interlayer dielectric layer 150, and may be connected to the gate electrode 110. The gate contact plug GCP may include a first gate contact segment GC1, and a second gate contact segment GC2 that protrudes in the third direction Z from a top surface 3 of the first gate contact segment GC1. The first gate contact segment GC1 may have a width WD1 that gradually increases as approaching the top surface 3 thereof. The second gate contact segment GC2 may have a width WD2 that gradually increases as departing from the top surface 3 of the first gate contact segment GC1. The first gate contact segment GC1 may have an upper width WD1' greater than a lower width WD2' of the second gate contact segment GC2 (WD1'>WD2'). The second gate contact segment GC2 may at least partially expose the top surface 3 of the first gate contact segment GC1.

The gate contact plug GCP may include a first metal plug 210 and a first barrier pattern 220. The first metal plug 210 may penetrate the gate capping pattern 120, the second interlayer dielectric layer 140, and the third interlayer dielectric layer 150. The first metal plug 210 may have a width that increases as departing from the gate electrode 110 (e.g., a first width of the first metal plug 210 may be less than a second width of the first metal plug 210 located a further distance from the gate electrode 110 than the first width). The first metal plug 210 may have a top surface US1 at the same level as that of a top surface of the third interlayer dielectric layer 150. In some embodiments, the first metal plug 210 may have a bottom surface LS1 in contact with the gate electrode 110, as seen in FIGS. 2A, 2C, and 2D.

The first barrier pattern 220 may be on a sidewall of the first metal plug 210 and may extend between the top surface of the gate electrode 110 and a bottom surface of the first metal plug 210. The first barrier pattern 220 may surround a portion of the sidewall of the first metal plug 210. The first metal plug 210 may be divided into a lower part LP1 and an upper part UP1. The lower part LP1 of the first metal plug 210 may be covered with the first barrier pattern 220, and the upper part UP1 of the first metal plug 210 may be exposed by the first barrier pattern 220. The upper part UP1 of the first metal plug 210 may have a sidewall exposed by the first barrier pattern 220. In other words, the upper part UP1 of the first metal plug 210 may have a sidewall that is free of the first barrier pattern 220. For example, the first barrier pattern 220 may have a top surface at a lower level than that of the top surface US1 of the first metal plug 210. When viewed in cross-section, the first barrier pattern 220 may include a first part P1 on a first sidewall SW1 of the first metal plug 210 and a second part P2 on a second sidewall SW2 of the first metal plug 210. The first sidewall SW1 and the second sidewall SW2 may face each other. When viewed in cross-section (e.g., FIG. 2A), the lower part LP1 of the first metal plug 210 may have a maximum width W1 substantially the same as a maximum spacing distance L1 between the first part P1 and the second part P2 (W1=L1). The first gate contact segment GC1 may include the first barrier pattern 220 and the lower part LP1 of the first metal plug 210. The second gate contact segment GC2 may include the upper part UP1 of the first metal plug 210.

A source/drain contact plug SCP may be on the source/drain pattern SDP. The source/drain contact plug SCP may penetrate the first, second, and third interlayer dielectric layers 130, 140, and 150, and may be connected to the source/drain pattern SDP. The source/drain contact plug SCP may include a first source/drain contact segment SC1, and a second source/drain contact segment SC2 that protrudes in the third direction Z from a top surface 5 of the first source/drain contact segment SC1. The first source/drain contact segment SC1 may have a width WD3 that gradually increases as approaching the top surface 5 thereof. The second source/drain contact segment SC2 may have a width WD4 that gradually increases as departing from the top surface 5 of the first source/drain contact segment SC1. The first source/drain contact segment SC1 may have an upper width WD3' greater than a lower width WD4' of the second source/drain contact segment SC2 (WD3'>WD4'). The second source/drain contact segment SC2 may expose the top surface 5 of the first source/drain contact segment SC1.

The source/drain contact plug SCP may include a second metal plug 310 and a second barrier pattern 320. The second metal plug 310 may penetrate the first, second, and third interlayer dielectric layers 130, 140, and 150, that may be in a portion of the source/drain pattern SDP. The second metal plug 310 may have a bottom surface LS2 at a lower level than that of a top surface of the source/drain pattern SDP. The second metal plug 310 may have a width that increases as departing from the source/drain pattern SDP. The second metal plug 310 may have a top surface US2 at the same level as that of the top surface of the third interlayer dielectric layer 150 and that of the top surface US1 of the first metal plug 210. The second metal plug 310 may have the bottom surface LS2 in contact with the source/drain pattern SDP, as seen in FIGS. 2A, 2B, and 2D.

The second barrier pattern 320 may be on a sidewall of the second metal plug 310 and may extend between a bottom surface of the second metal plug 310 and a top surface of the recessed source/drain pattern SDP. The second barrier pattern 320 may surround a portion of the sidewall of the second metal plug 310. The second metal plug 310 may be divided into a lower part LP2 and an upper part UP2. The lower part LP2 of the second metal plug 310 may be covered with the second barrier pattern 320, and the upper part UP2 of the second metal plug 310 may be exposed by the second barrier pattern 320. The upper part UP2 of the second metal plug 310 may have a sidewall exposed by the second barrier pattern 320. In other words, the upper part UP2 of the second metal plug 310 may have a sidewall that is free of the second barrier pattern 320. For example, the second barrier pattern 320 may have a top surface at a lower level than that of the top surface US2 of the second metal plug 310. The top surface of the second barrier pattern 320 may be located at the same level as that of the top surface of the first barrier pattern 220. The first source/drain contact segment SC1 may include the second barrier pattern 320 and the lower part LP2 of the second metal plug 310. The second source/drain contact segment SC2 may include the upper part UP2 of the second metal plug 310.

The second barrier pattern 320 may include a third part P3 on a third sidewall SW3 of the second metal plug 310 and a fourth part P4 on a fourth sidewall SW4 of the second metal plug 310. The third sidewall SW3 and the fourth sidewall SW4 may face each other. The lower part LP2 of the second metal plug 310 may have a maximum width W2 substantially the same as a maximum spacing distance L2 between the third part P3 and the fourth part P4 (W2=L2). The upper part UP1 of the first metal plug 210 may have a thickness substantially the same as that of the upper part UP2 of the second metal plug 310.

The first and second metal plugs 210 and 310 may include a metallic material, for example, one or more of aluminum, copper, tungsten, molybdenum, and cobalt. The first and second barrier patterns 220 and 320 may include a metal nitride layer, for example, one or more of a titanium nitride layer, a tungsten nitride layer, and a tantalum nitride layer.

In some embodiments, when viewed in a plan view, the gate contact plug GCP may horizontally overlap the source/drain contact plug SCP. For example, when viewed in a plan view, the gate contact plug GCP and the source/drain contact plug SCP may overlap each other in the first direction X. The gate contact plug GCP may be between a plurality of source/drain contact plugs SCP adjacent to each other in the first direction X.

According to some example embodiments of the present inventive concepts, because the first barrier pattern 220 is not on the sidewall of the upper part UP1 of the first metal plug 210, and because the second barrier pattern 320 is not on the sidewall of the upper part UP2 of the second metal plug 310, it may be possible to increase a spacing distance between the gate contact plug GCP and the source/drain contact plug SCP. As a result, an electrical short may be avoided between the gate contact plug GCP and the source/drain contact plug SCP.

Figure 3A:
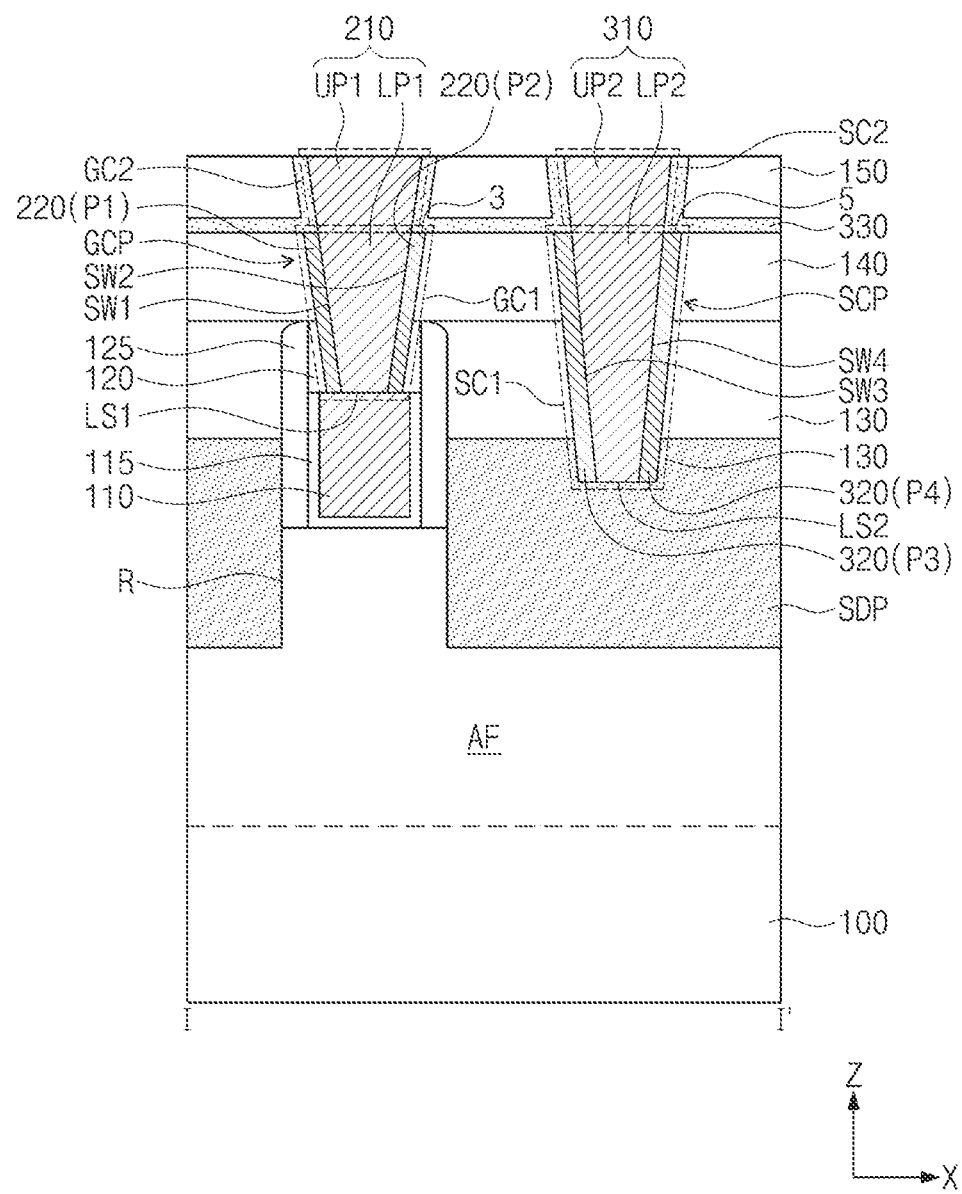
FIG. 3A illustrates a cross-sectional view taken along line I-I' of FIG. 1, showing a semiconductor device according to some example embodiments of the present inventive concepts.
Figure 3B:
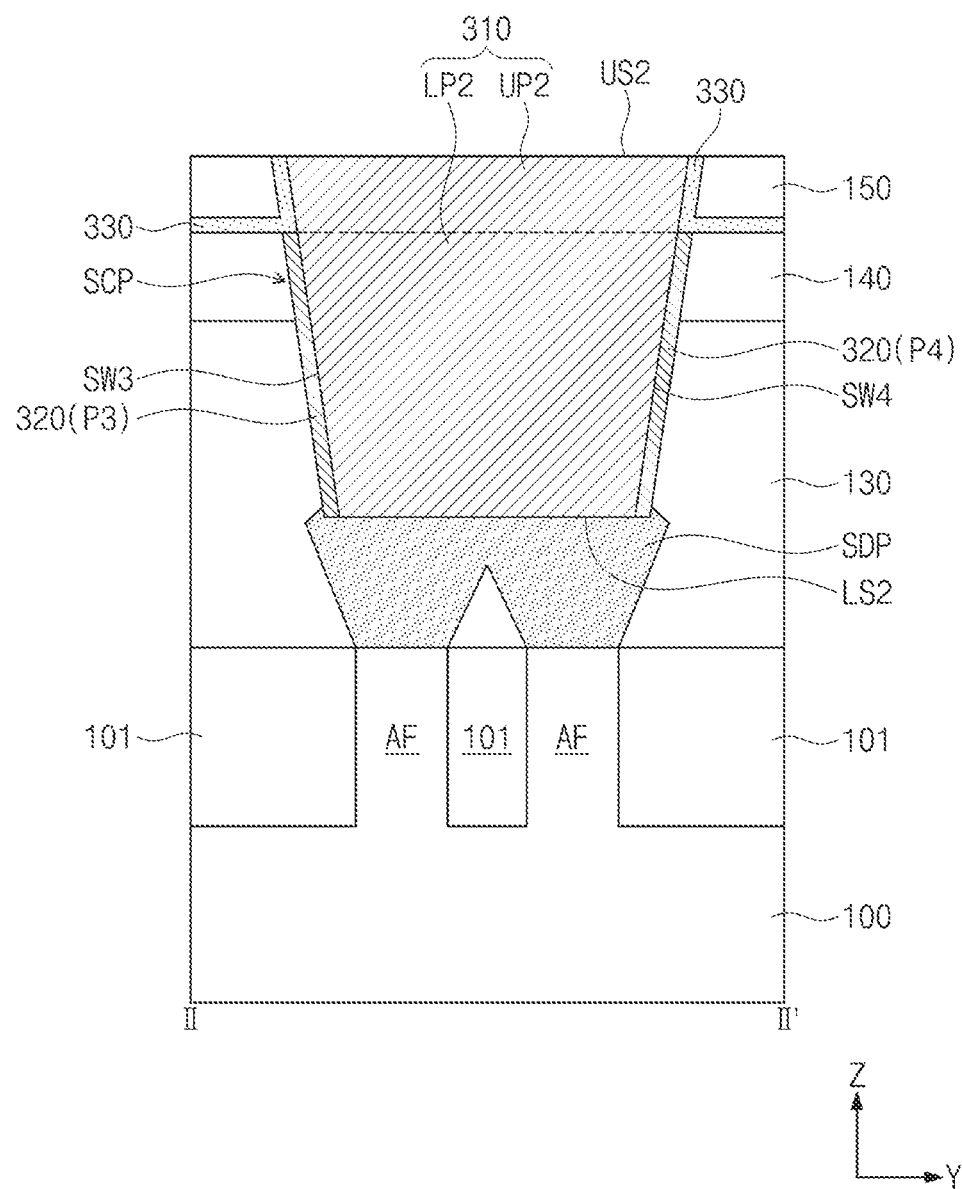
FIG. 3B illustrates a cross-sectional view taken along line II-II' of FIG. 1, showing a semiconductor device according to some example embodiments of the present inventive concepts.
Figure 3C:
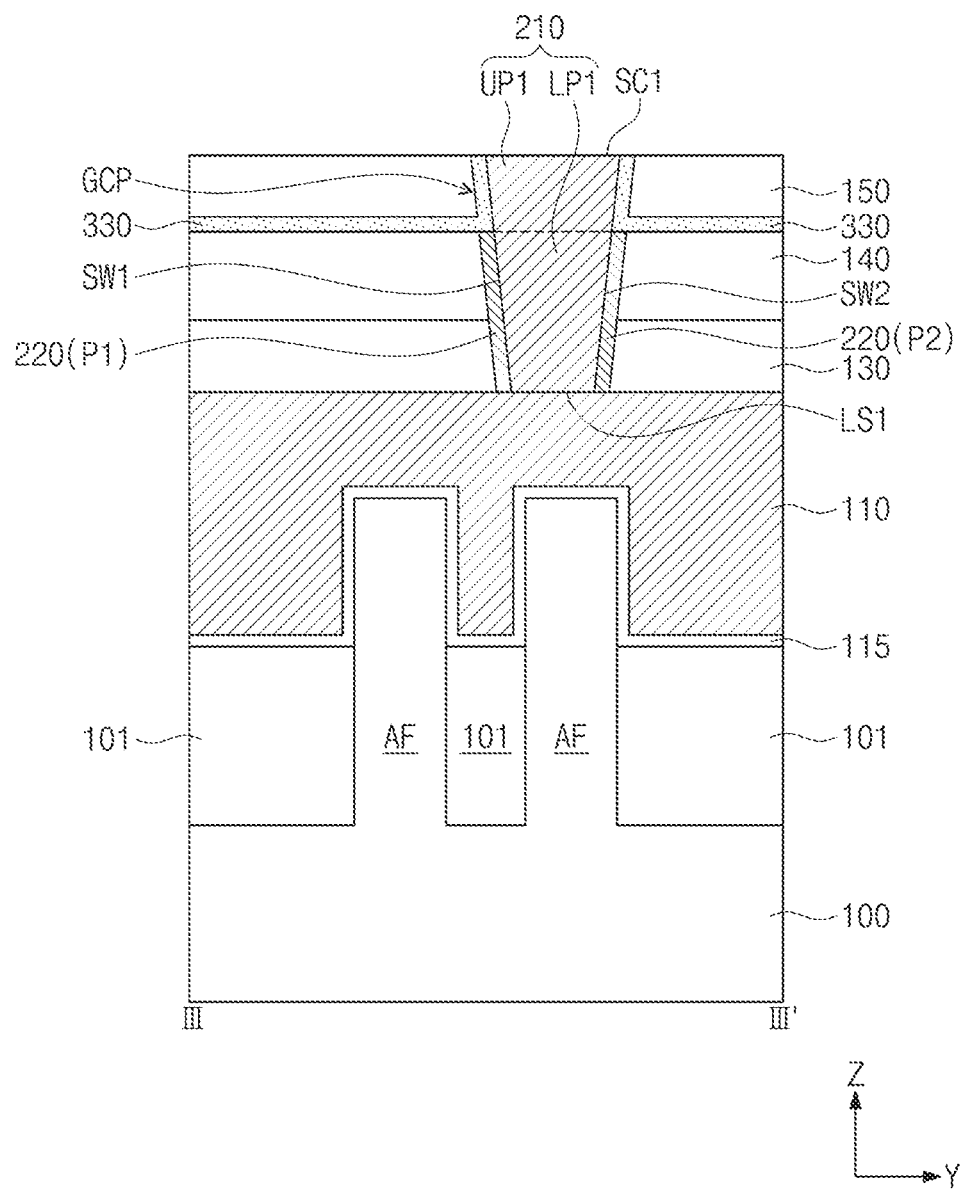
FIG. 3C illustrates a cross-sectional view taken along line III-III' of FIG. 1, showing a semiconductor device according to some example embodiments of the present inventive concepts.

FIG. 3A illustrates a cross-sectional view taken along line I-I' of FIG. 1, showing a semiconductor device according to some example embodiments of the present inventive concepts. FIG. 3B illustrates a cross-sectional view taken along line II-II' of FIG. 1, showing a semiconductor device according to some example embodiments of the present inventive concepts. FIG. 3C illustrates a cross-sectional view taken along line III-III' of FIG. 1, showing a semiconductor device according to some example embodiments of the present inventive concepts.

Referring to FIGS. 3A to 3C, a barrier dielectric layer 330 may be on a sidewall of the second gate contact segment GC2 and the top surface 3 of the first gate contact segment GC1. The barrier dielectric layer 330 may also be on a sidewall of the second source/drain contact segment SC2 and the top surface 5 of the first source/drain contact segment SC1. The barrier dielectric layer 330 may expose a sidewall of the first gate contact segment GC1 and a sidewall of the first source/drain contact segment SC1. The barrier dielectric layer 330 may extend into a gap between the second interlayer dielectric layer 140 and the third interlayer dielectric layer 150. For example, the barrier dielectric layer 330 may be interposed between the second interlayer dielectric layer 140 and the third interlayer dielectric layer 150.

The barrier dielectric layer 330 may be interposed between the third interlayer dielectric layer 150 and the sidewall of the upper part UP1 of the first metal plug 210 and between the third interlayer dielectric layer 150 and the sidewall of the upper part UP2 of the second metal plug 310. The barrier dielectric layer 330 may contact the top surface of the first barrier pattern 220 and the top surface of the second barrier pattern 320. The barrier dielectric layer 330 may extend into a gap between the top surface of the second interlayer dielectric layer 140 and the bottom surface of the third interlayer dielectric layer 150. The barrier dielectric layer 330 may expose the top surface of the gate contact plug GCP and the top surface of the source/drain contact plug SCP. That is, the upper surface US1 of the first metal plug 210 and the upper surface of the second metal plug 310 may be free of the barrier dielectric layer 330. The barrier dielectric layer 330 may include, for example, a silicon nitride layer.

Figure 4:
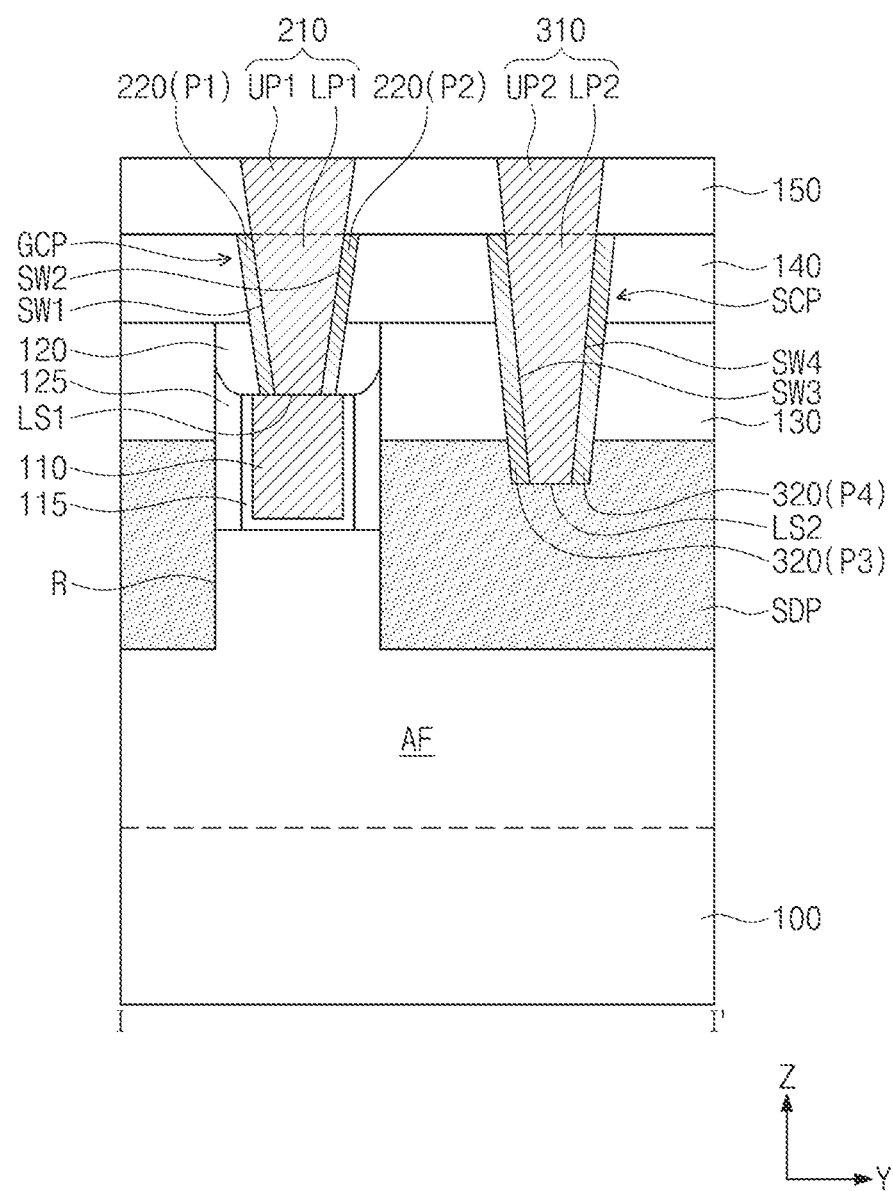
FIG. 4 illustrates a cross-sectional view taken along line I-I' of FIG. 1, showing a semiconductor device according to some example embodiments of the present inventive concepts.

FIG. 4 illustrates a cross-sectional view taken along line I-I' of FIG. 1, showing a semiconductor device according to some example embodiments of the present inventive concepts.

Referring to FIG. 4, the gate capping pattern 120 may have a top surface whose width in the first direction X is the same as a width in the first direction X of the active fin AF. The gate capping pattern 120 may have a width in the first direction X that decreases as approaching the active fin AF. The gate capping pattern 120 may contact the first interlayer dielectric layer 130.

Figure 5:
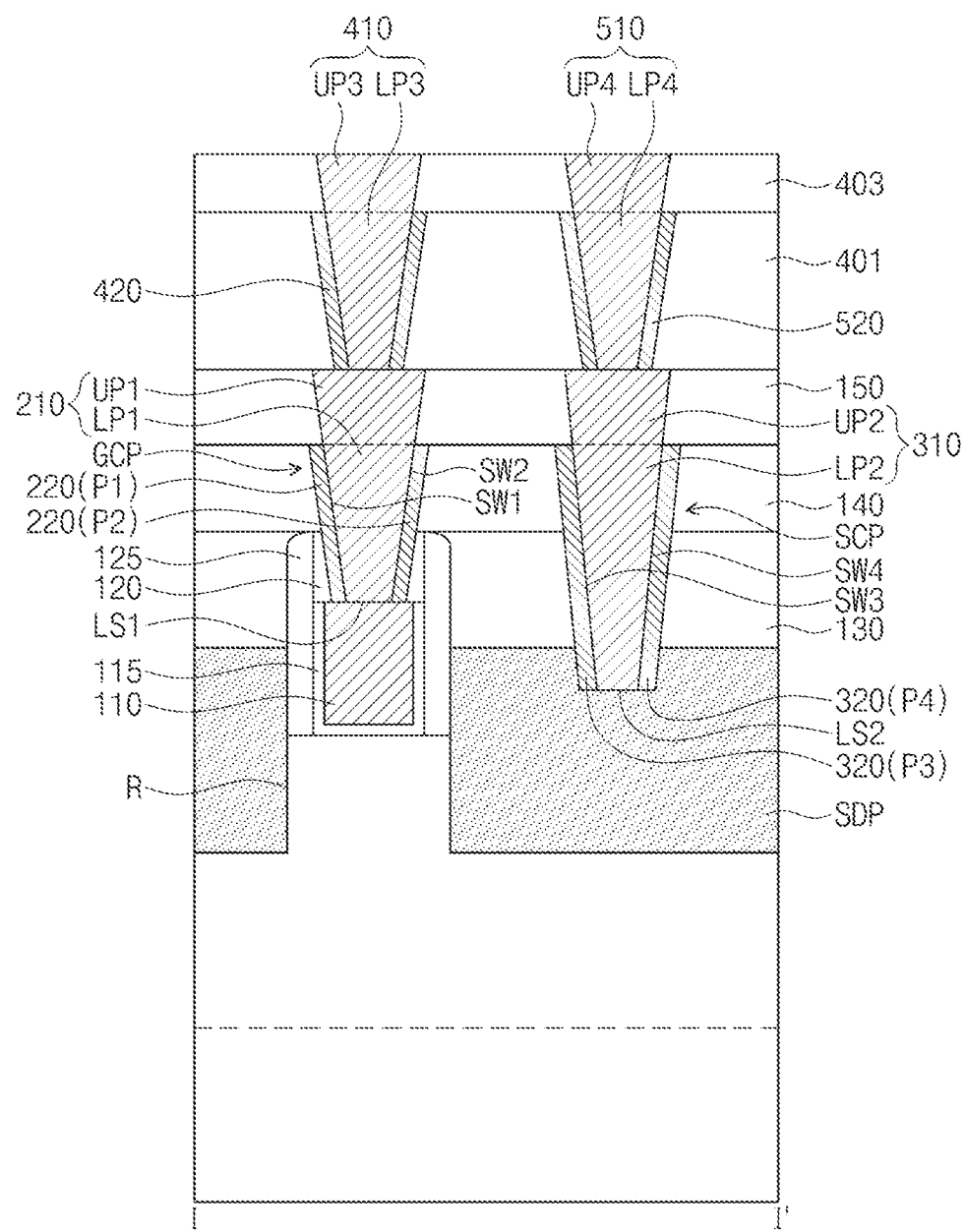
FIG. 5 illustrates a cross-sectional view taken along line I-I' of FIG. 1, showing a semiconductor device according to some example embodiments of the present inventive concepts.

FIG. 5 illustrates a cross-sectional view taken along line I-I' of FIG. 1, showing a semiconductor device according to some example embodiments of the present inventive concepts.

Referring to FIG. 5, a fourth interlayer dielectric layer 401 and a fifth interlayer dielectric layer 403 may be sequentially formed on the third interlayer dielectric layer 150. The fourth and fifth interlayer dielectric layers 401 and 403 may include the same material as that of the third interlayer dielectric layer 150. A second gate contact plug GCP2 and a second source/drain contact plug SCP2 may penetrate the fourth and fifth interlayer dielectric layers 401 and 403. The second gate contact plug GCP2 may be on the gate contact plug GCP, and the second source/drain contact plug SCP2 may be on the source/drain contact plug SCP. The second gate contact plug GCP2 may include a third metal plug 410 and a third barrier pattern 420. The third barrier pattern 420 may surround a sidewall of a lower part LP3 of the third metal plug 410 and may expose a sidewall of an upper part UP3 of the third metal plug 410. The third metal plug 410 may have a bottom surface in contact with the first metal plug 210.

The second source/drain contact plug SCP2 may include a fourth metal plug 510 and a fourth barrier pattern 520. The fourth barrier pattern 520 may surround a sidewall of a lower part LP4 of the fourth metal plug 510 and may expose a sidewall of an upper part UP4 of the fourth metal plug 510. The fourth metal plug 510 may have a bottom surface in contact with the second metal plug 310.

FIGS. 6A to 12A illustrate cross-sectional views taken along line I-I' of FIG. 1, showing operations of methods of fabricating a semiconductor device according to some example embodiments of the present inventive concepts. FIGS. 6B to 12B illustrate cross-sectional views taken along line II-II' of FIG. 1, showing operations of the methods of fabricating a semiconductor memory device according to some example embodiments of the present inventive concepts. FIGS. 6C to 12C illustrate cross-sectional views taken along line III-III' of FIG. 1, showing operations of the methods of fabricating a semiconductor device according to some example embodiments of the present inventive concepts.

Figure 6A:
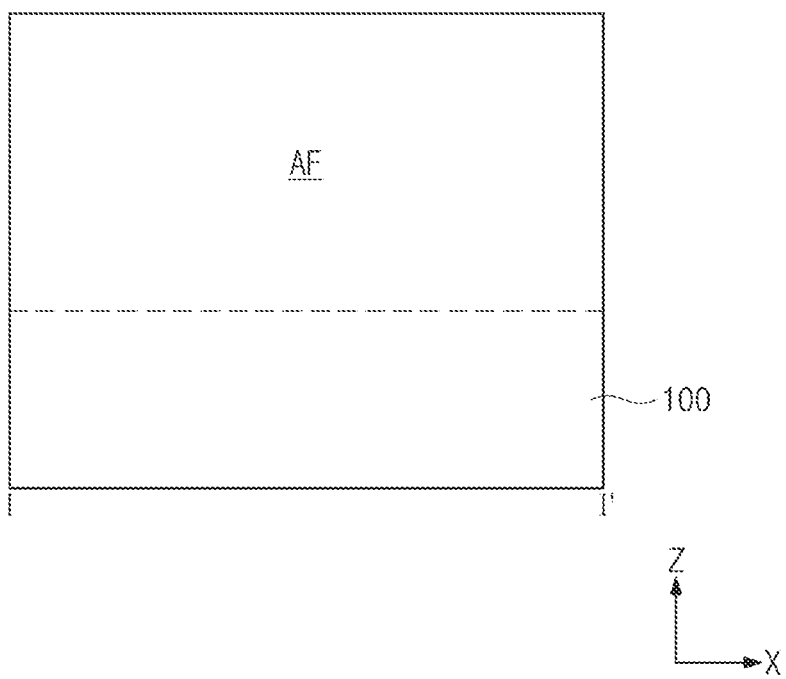
Figure 6B:
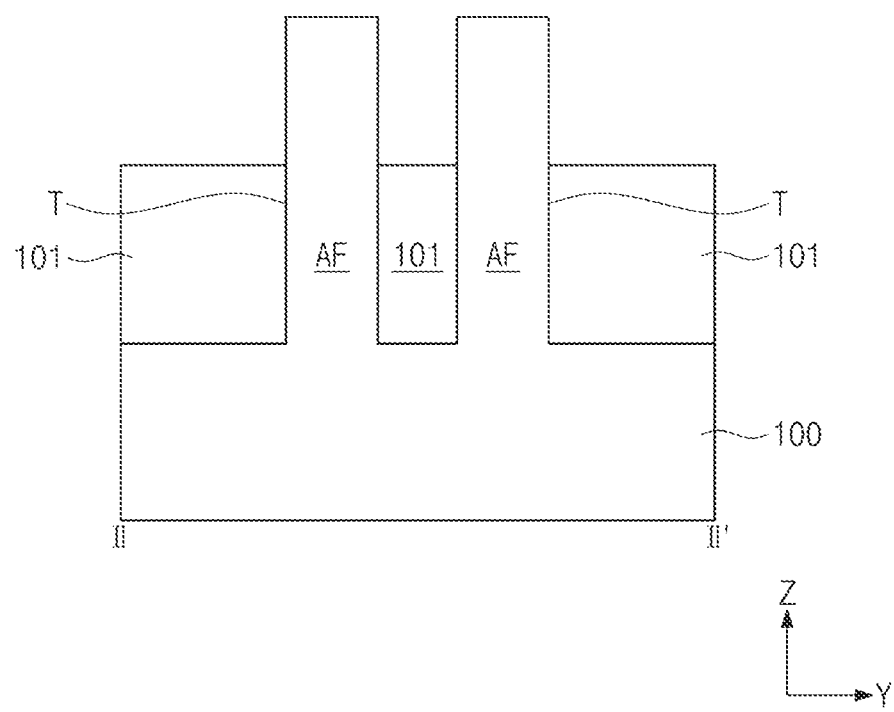
Figure 6C:
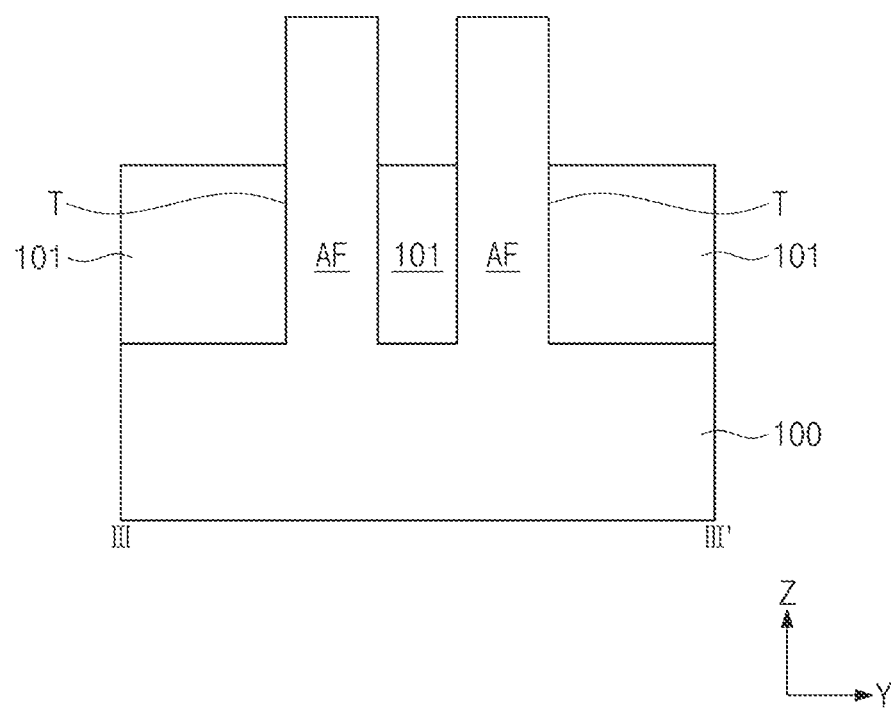

Referring to FIGS. 6A, 6B, and 6C, a device isolation layer 101 may be formed in a substrate 100. The formation of the device isolation layer 101 may include forming a mask pattern (not shown) on the substrate 100, forming a trench T in the substrate 100 by using the mask pattern as an etching mask to anisotropically etch an upper portion of the substrate 100, filling the trench T with a dielectric material, and performing a planarization process on the dielectric material until a top surface of the substrate 100 is exposed. The device isolation layer 101 may define an active region of the substrate 100. An active fin AF may be formed by etching an upper portion of the device isolation layer 101. The active fin AF may protrude from the top surface of the substrate 100. In some embodiments, the active fin AF may have a top surface at a higher level than that of a top surface of the device isolation layer 101. The active fin AF may extend in a first direction X.

Figure 7A:
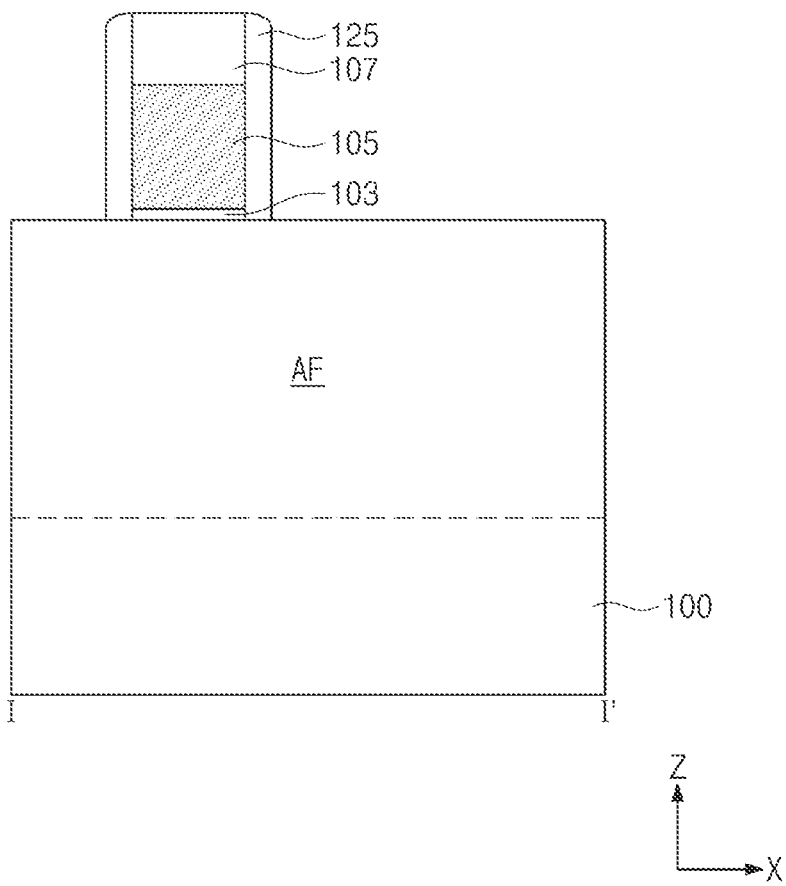
Figure 7B:
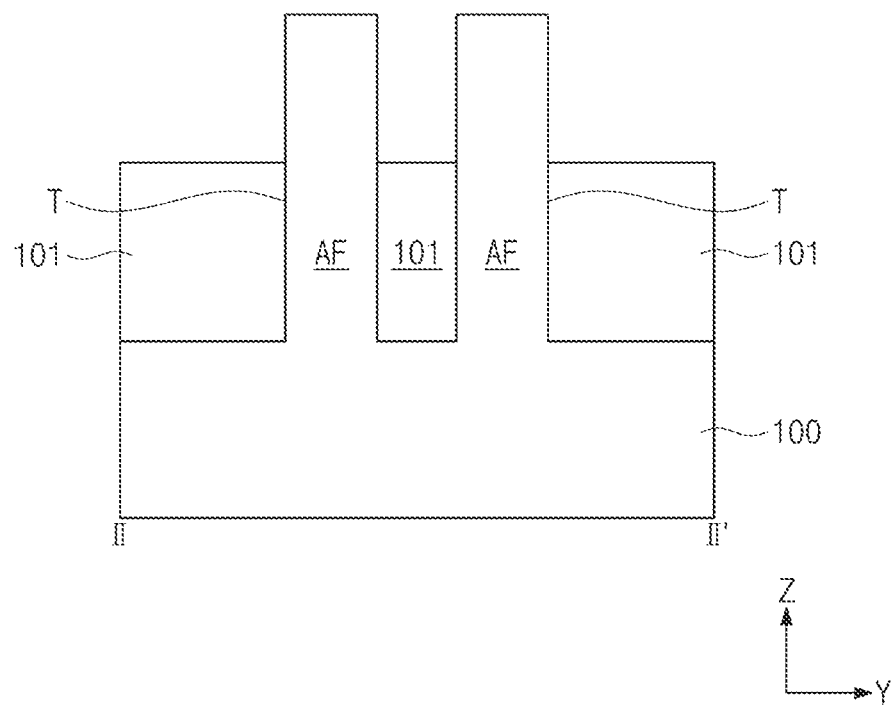
Figure 7C:
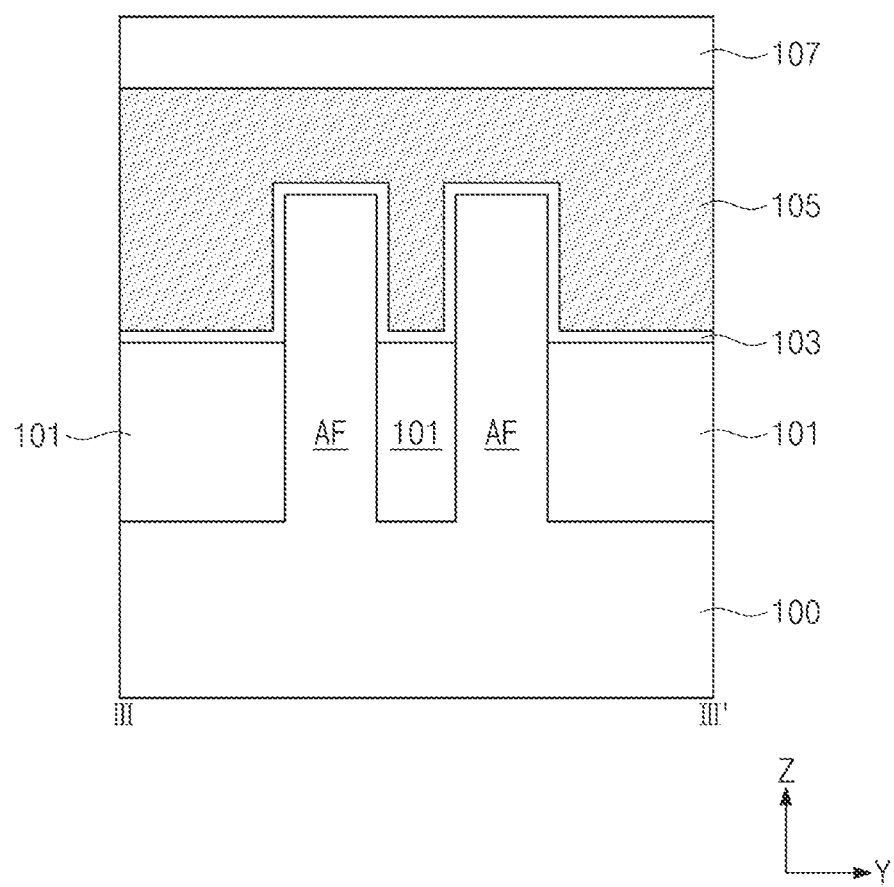

Referring to FIGS. 7A, 7B, and 7C, a preliminary dielectric pattern 103, a preliminary gate pattern 105, and a preliminary capping pattern 107 may be sequentially formed on the substrate 100. The preliminary dielectric pattern 103, the preliminary gate pattern 105, and the preliminary capping pattern 107 may be formed by sequentially forming a preliminary dielectric layer (not shown), a preliminary gate layer (not shown), and a preliminary capping layer (not shown) on the substrate 100, and then performing an etching process to sequentially pattern the preliminary capping layer, the preliminary gate layer, and the preliminary dielectric layer. The preliminary dielectric pattern 103, the preliminary gate pattern 105, and the preliminary capping pattern 107 may extend in a second direction Y intersecting the first direction X, running across the active fin AF. The preliminary dielectric pattern 103 may partially cover the top surface and sidewall of the active fin AF and also partially cover the top surface of the device isolation layer 101. The preliminary dielectric pattern 103 may include, for example, a silicon oxide layer, a high-k dielectric layer, or a silicon nitride layer. The preliminary gate pattern 105 may include at least one layer having an etch selectivity with respect to the preliminary dielectric pattern 103. The preliminary gate pattern 105 may include, for example, a polysilicon layer. The preliminary capping pattern 107 may include, for example, a silicon oxide layer.

A spacer 125 may be formed on sidewalls of the preliminary dielectric pattern 103, of the preliminary gate pattern 105, and of the preliminary capping pattern 107. The spacer 125 may extend in the second direction Y along the sidewalls of the preliminary dielectric pattern 103, of the preliminary gate pattern 105, and of the preliminary capping pattern 107. The spacer 125 may include, for example, one or more of a silicon nitride layer and a silicon oxynitride layer.

Figure 8A:
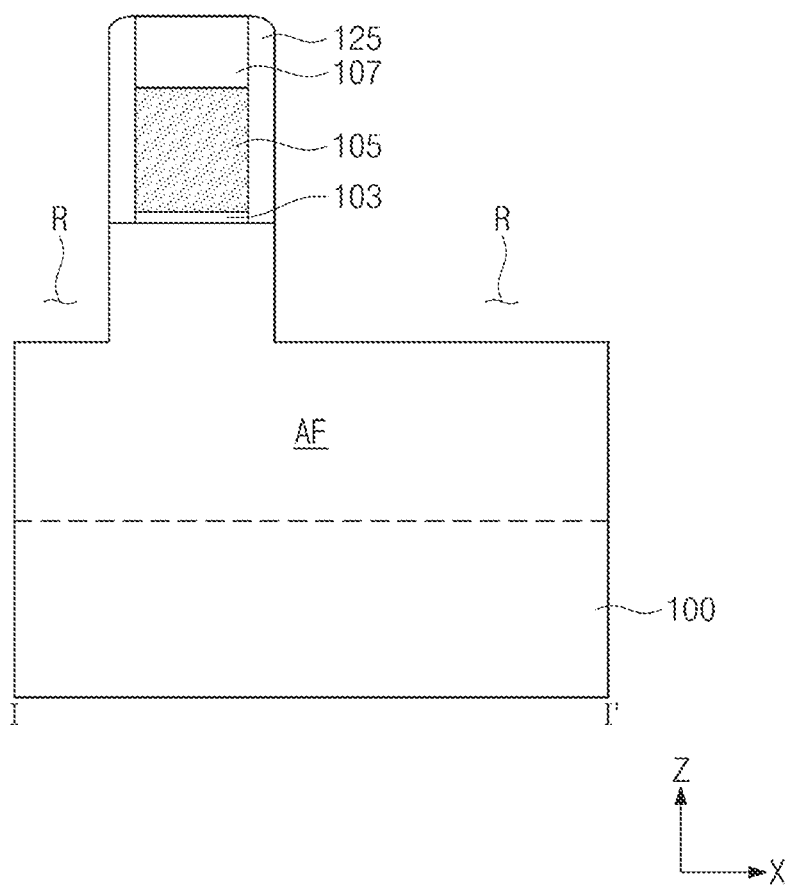
Figure 8B:
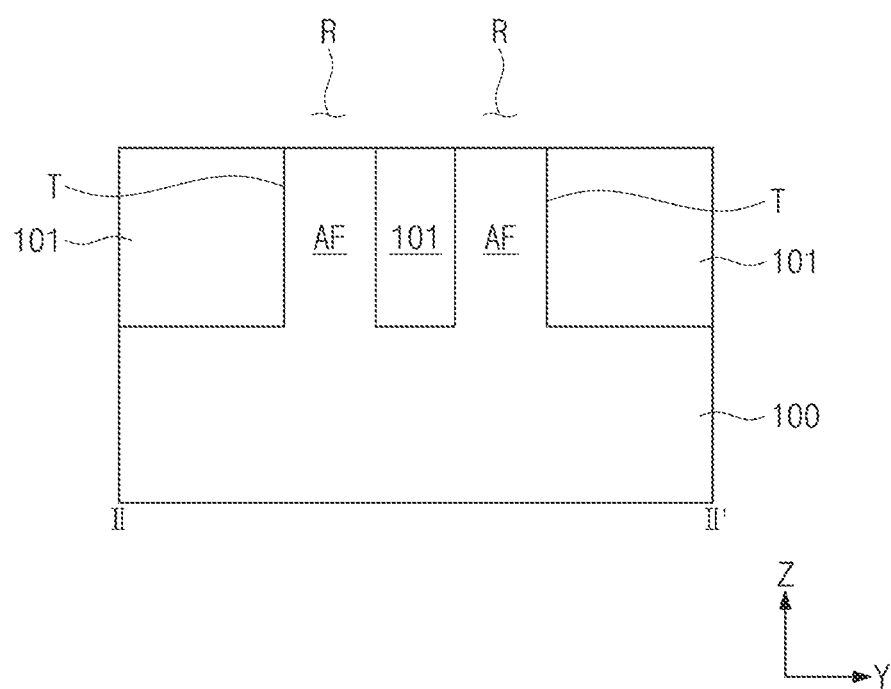
Figure 8C:
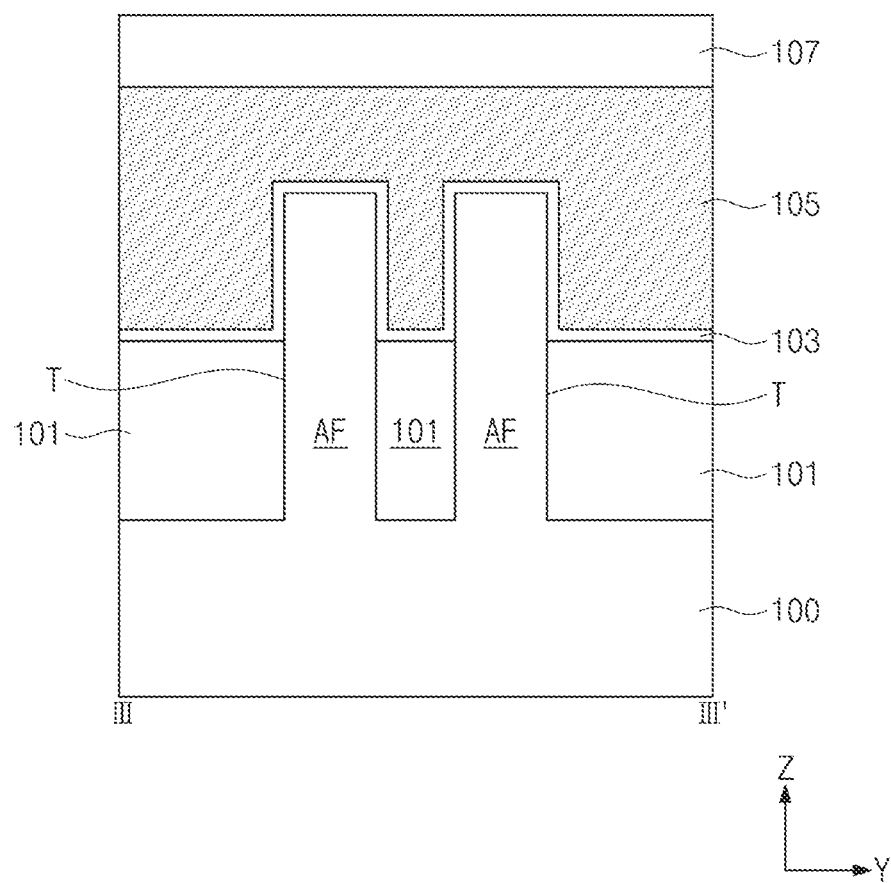

Referring to FIGS. 8A, 8B, and 8C, a recess region R may be formed in the active fin AF. The recess region R may be formed by recessing the top surface of the active fin AF exposed by the preliminary capping pattern 107. The recess region R may have a bottom surface at a lower level than that of the top surface of the active fin AF. The bottom surface of the recess region R may be located at substantially the same level as that of the top surface of the device isolation layer 101.

Figure 9A:
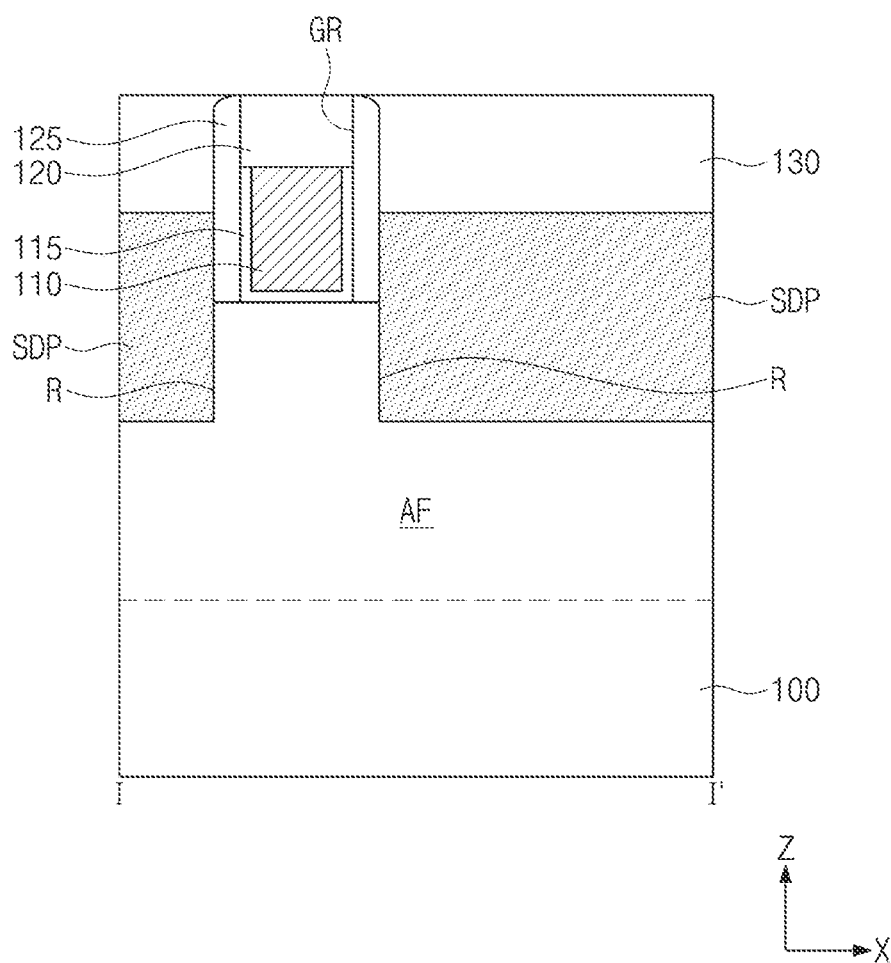
Figure 9B:
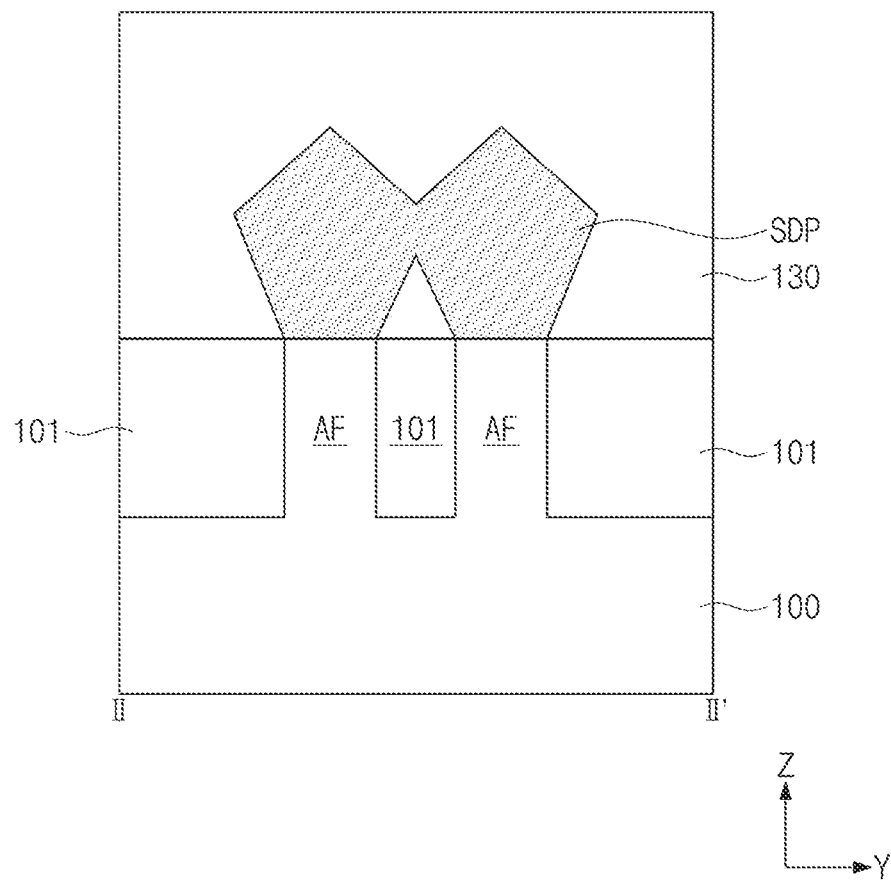
Figure 9C:
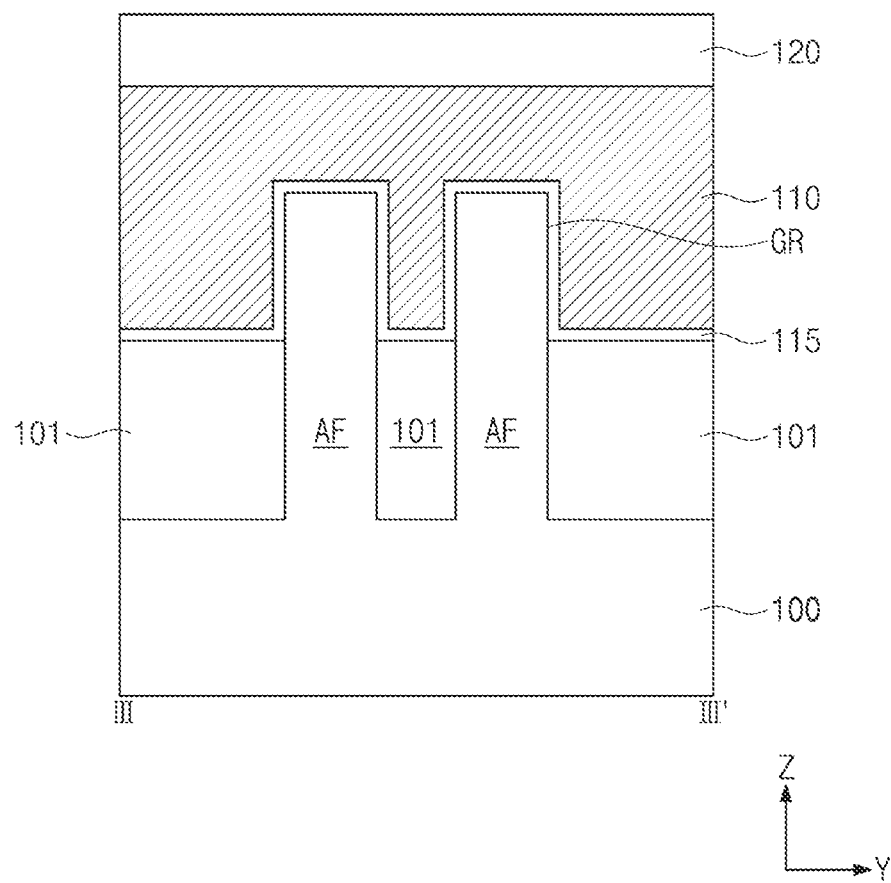

Referring to FIGS. 9A, 9B, and 9C, a source/drain pattern SDP may be formed in the recess region R. The formation of the source/drain pattern SDP may include forming an epitaxial layer by performing an epitaxial process in which the bottom surface and sidewalls of the recess region R are used as a seed. The source/drain pattern SDP may be formed to have a diamond shape. The source/drain pattern SDP may have a top surface at a level the same as or higher than that of the top surface of the active fin AF. The formation of a single source/drain pattern SDP may include forming a plurality of epitaxial layers in a plurality of recess regions R that are formed in a plurality of active fins AF, and merging a plurality of epitaxial layers that are grown in different recess regions R facing each other in the second direction Y. The source/drain pattern SDP may extend in the second direction Y on a side of the preliminary gate pattern 105. The source/drain pattern SDP may include, for example, silicon (Si), silicon germanium (SiGe), or silicon carbide (SiC). The source/drain pattern SDP may be doped with, for example, N-type or P-type impurities.

A first interlayer dielectric layer 130 may be formed on the source/drain pattern SDP. The formation of the first interlayer dielectric layer 130 may include forming a dielectric layer to cover top, lateral, and bottom surfaces of the source/drain pattern SDP, and then performing a planarization process on the dielectric layer until a top surface of the preliminary capping pattern 107 is exposed. The preliminary capping pattern 107, the preliminary gate pattern 105, and the preliminary dielectric pattern 103 may be sequentially removed to form a gap region GR. The gap region GR may expose portions of the top surface and sidewall of the active fin AF, portions of the top surface of the device isolation layer 101, and an inner wall of the spacer 125. The preliminary capping pattern 107, the preliminary gate pattern 105, and the preliminary dielectric pattern 103 may be selectively removed using an etch recipe that has an etch selectivity with respect to the substrate 100 and the spacer 125.

A gate dielectric layer 115 and a gate electrode 110 may be formed in the gap region GR. The gate dielectric layer 115 may conformally cover the portions of the top surface and sidewall of the active fin AF and the inner wall of the spacer 125, which portions and the inner wall are exposed in the gap region GR. The gate electrode 110 may fill the gap region GR on the gate dielectric layer 115. An etching process may be performed to etch the gate electrode 110 and the spacer 125, with the result that the gate electrode 110 and the spacer 125 may be recessed on their top surfaces. Therefore, the inner sidewall of the spacer 125 may be partially exposed. A gate capping pattern 120 may be formed in the gap region GR. The gate capping pattern 120 may cover the top surface of the gate electrode 110 and a top surface of the gate dielectric layer 115. The formation of the gate capping pattern 120 may include forming a dielectric layer to fill the gap region GR and to cover a top surface of the first interlayer dielectric layer 130, and then performing a planarization process on the dielectric layer until the top surface of the first interlayer dielectric layer 130 is exposed.

Figure 10A:
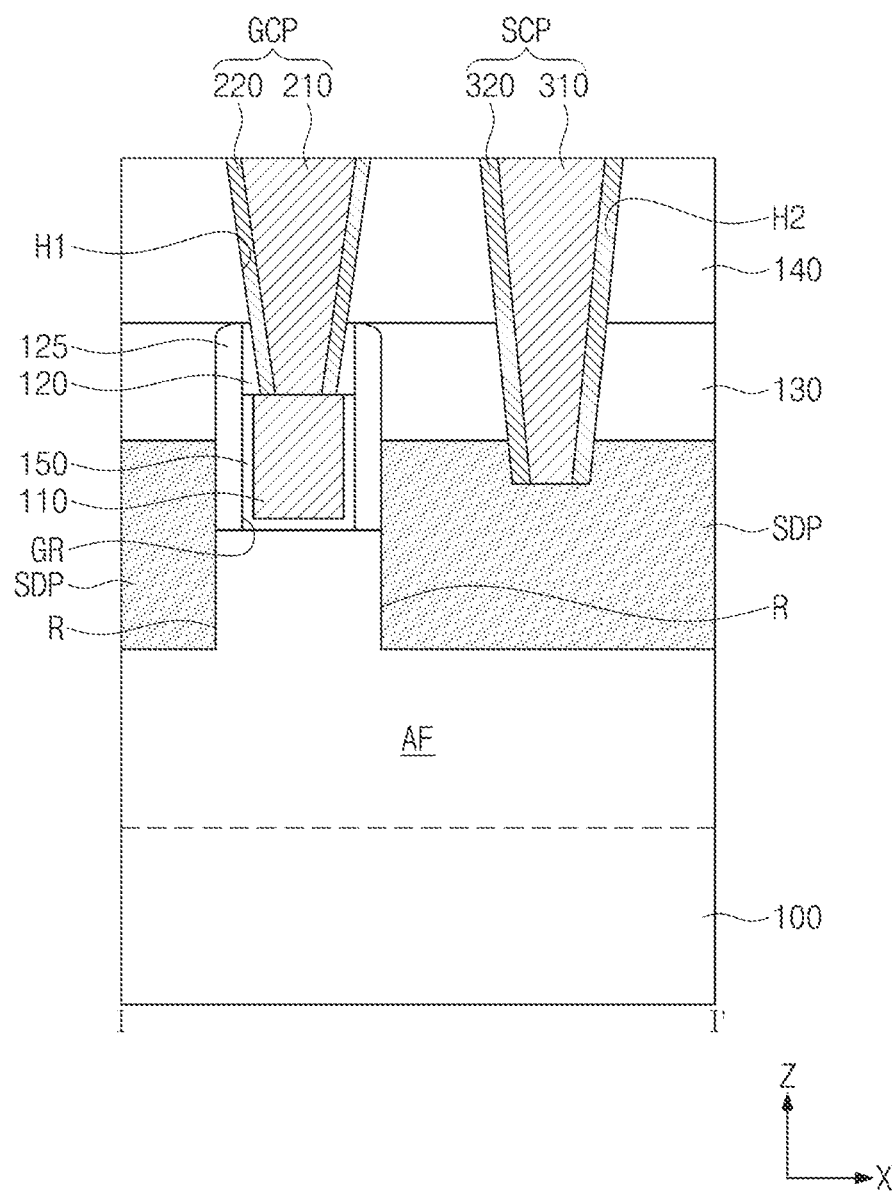
Figure 10B:
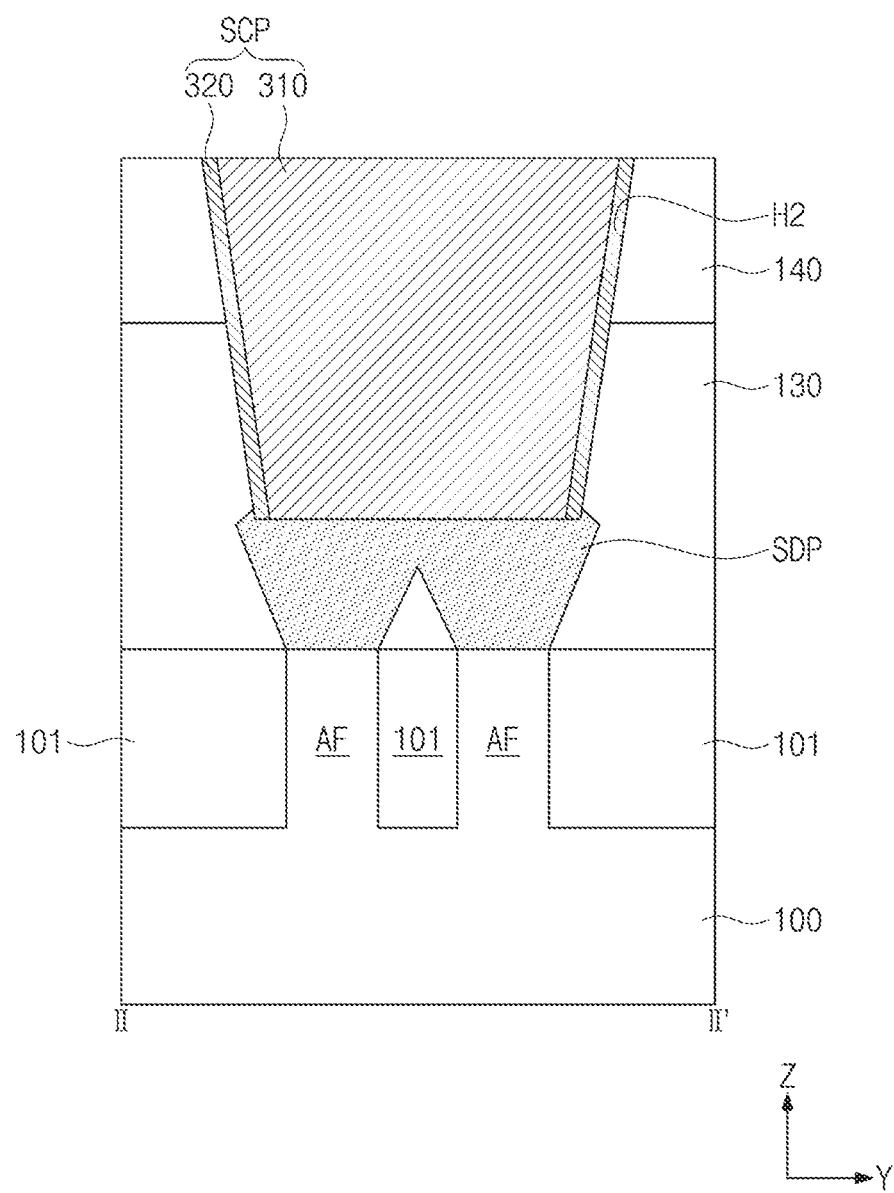
Figure 10C:
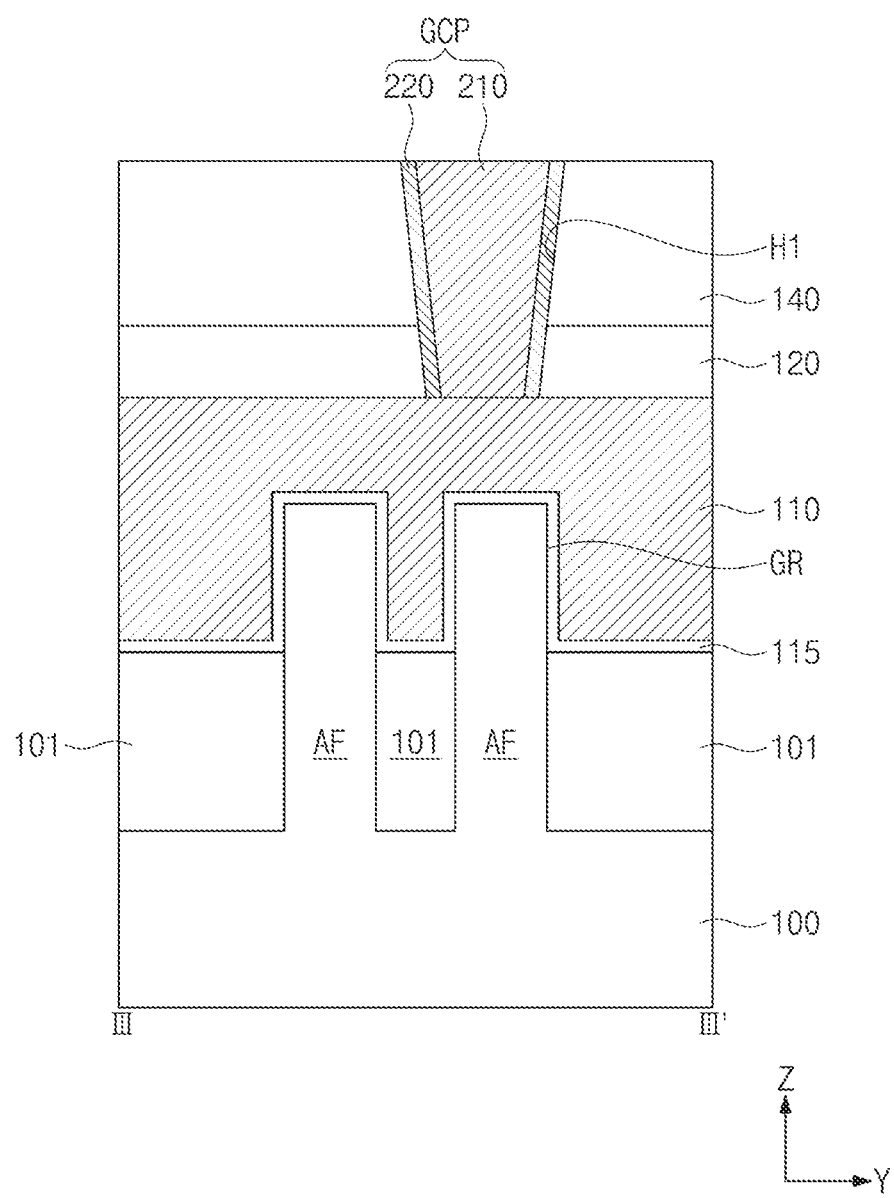

Referring to FIGS. 10A, 10B, and 10C, a second interlayer dielectric layer 140 may be formed on the first interlayer dielectric layer 130. The second interlayer dielectric layer 140 may cover the top surface of the first interlayer dielectric layer 130, of the gate capping pattern 120, and of the spacer 125. The second interlayer dielectric layer 140 may be formed of the same material as that the first interlayer dielectric layer 130. A first contact hole H1 and a second contact hole H2 may be formed. The first contact hole H1 may be formed on the gate electrode 110. The second contact hole H2 may be formed on the source/drain pattern SDP. The first contact hole H1 may be formed by patterning the second interlayer dielectric layer 140, the first interlayer dielectric layer 130, and the gate capping pattern 120. The first contact hole H1 may expose the top surface of the gate electrode 110. The second contact hole H2 may be formed by patterning the second and first interlayer dielectric layers 140 and 130 and partially etching an upper portion of the source/drain pattern SDP. The second contact hole H2 may partially expose the top surface of the source/drain pattern SDP. An anisotropic etching process may be performed to form the first contact hole H1 and the second contact hole H2.

A gate contact plug GCP and a source/drain contact plug SCP may be formed. The gate contact plug GCP may be formed in the first contact hole H1, and the source/drain contact plug SCP may be formed in the second contact hole H2. The formation of the gate contact plug GCP and the source/drain contact plug SCP may include forming a barrier layer (not shown) to cover a top surface of the second interlayer dielectric layer 140 and sidewalls and bottom surfaces of the first and second contact holes H1 and H2, exposing the top surfaces of the gate electrode 110 and the source/drain pattern SDP by etching the barrier layer formed on the bottom surfaces of the first and second contact holes H1 and H2, forming a metal plug layer (not shown) to fill the first and second contact holes H1 and H2 and to cover the top surface of the second interlayer dielectric layer 140, and performing a planarization process on the metal plug layer and the barrier layer until the top surface of the second interlayer dielectric layer 140 is exposed.

The gate contact plug GCP may include a first metal plug 210 and a first barrier pattern 220. The first metal plug 210 may be formed in the first contact hole H1, and the first barrier pattern 220 may cover a sidewall and a bottom surface of the first metal plug 210 in the first contact hole H1. The source/drain contact plug SCP may include a second metal plug 310 and a second barrier pattern 320. The second metal plug 310 may be formed in the second contact hole H2, and the second barrier pattern 320 may cover a sidewall and a bottom surface of the second metal plug 310 in the second contact hole H2.

Figure 11A:
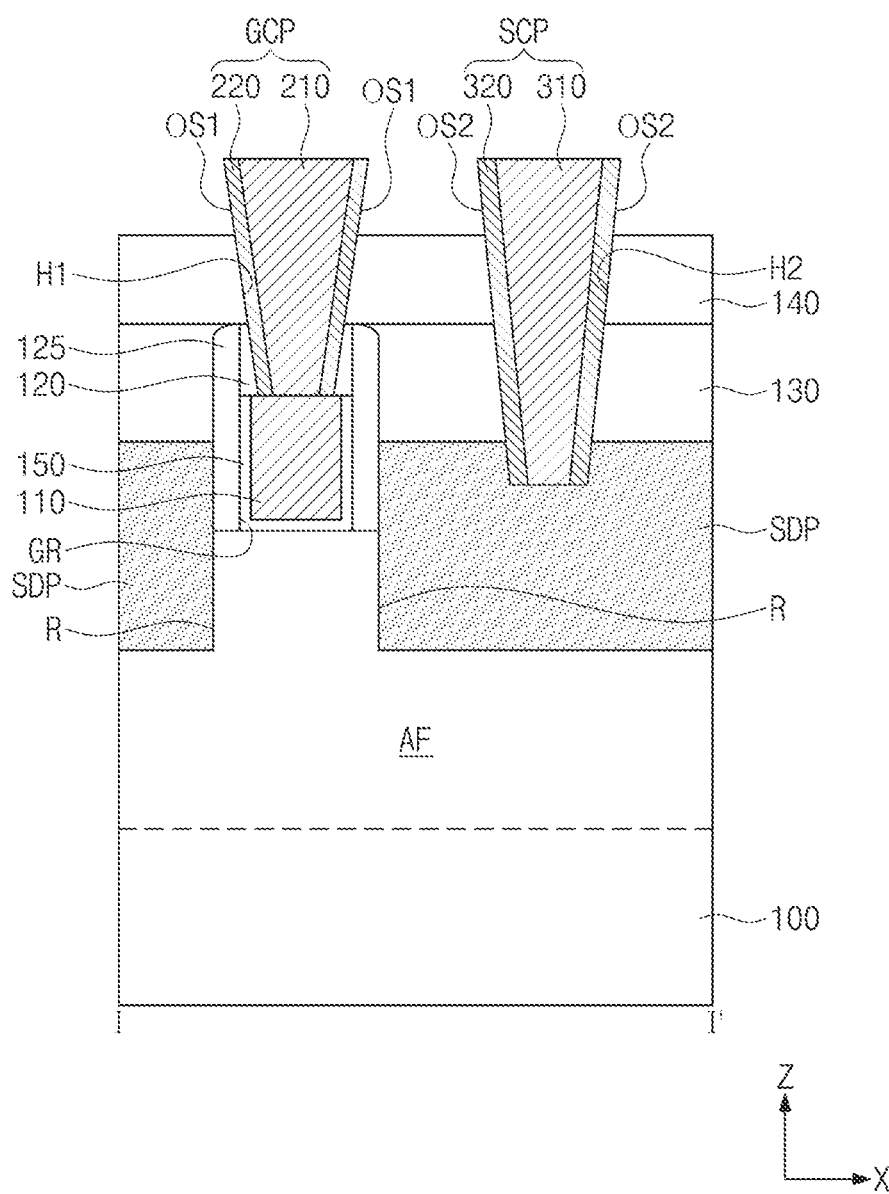
Figure 11B:
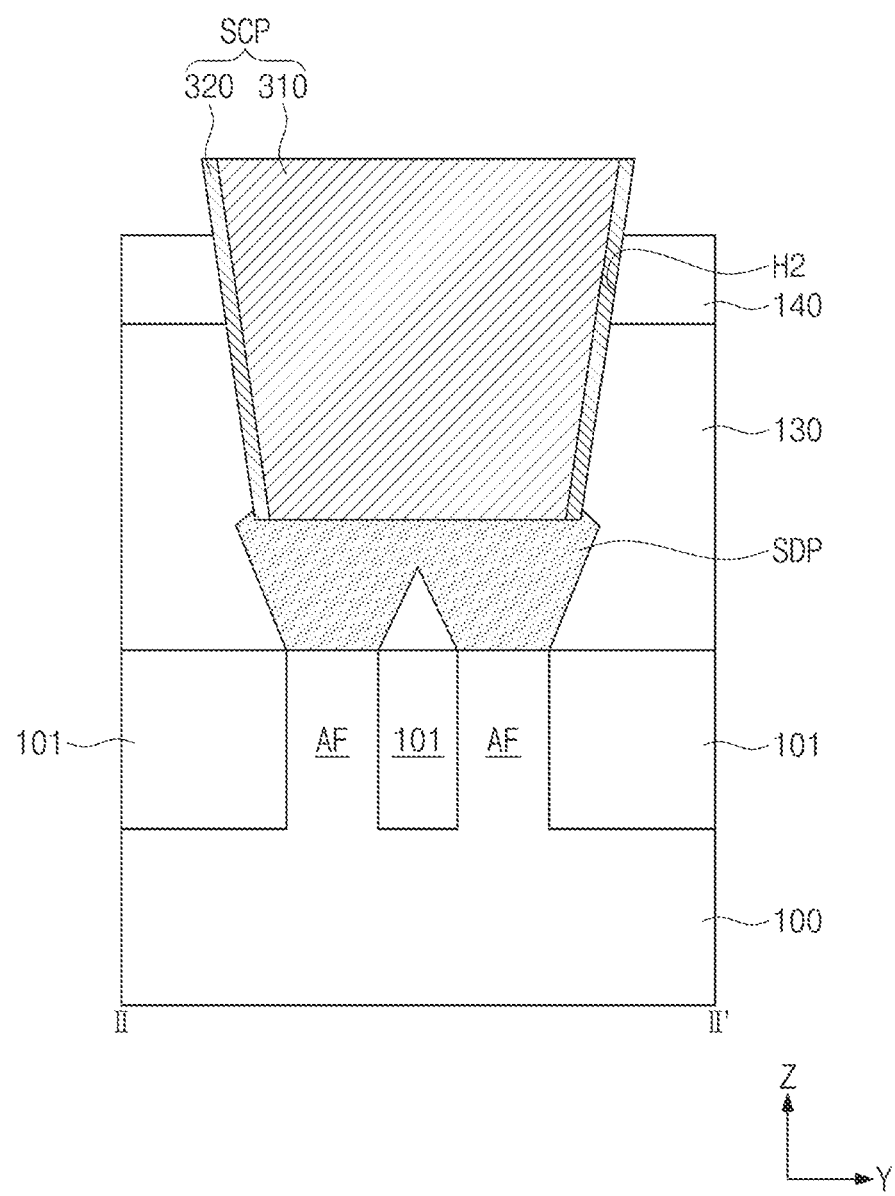
Figure 11C:
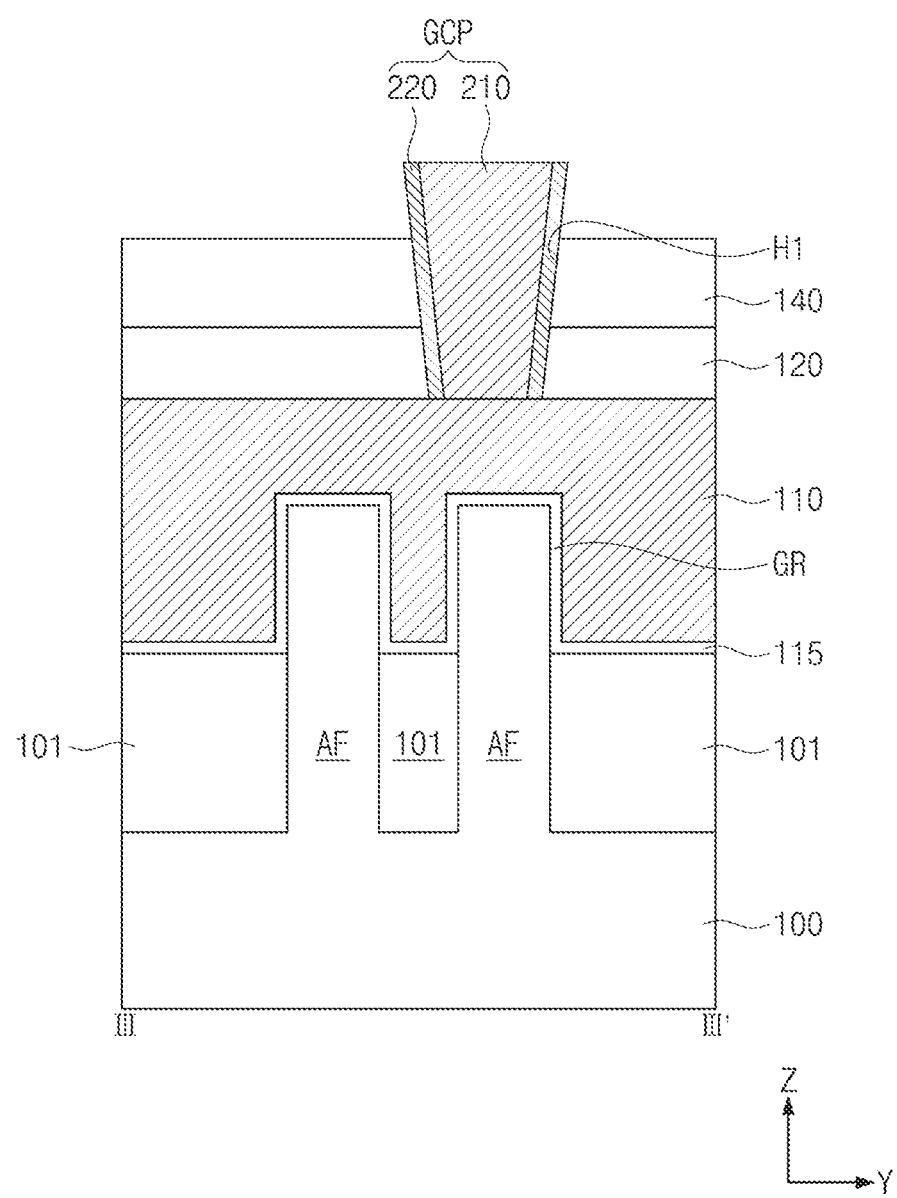

Referring to FIGS. 11A, 11B, and 11C, an upper portion of the second interlayer dielectric layer 140 may be etched to reduce a thickness of the second interlayer dielectric layer 140. Thus, an upper sidewall of each of the gate contact plug GCP and the source/drain contact plug SCP may be exposed from the second interlayer dielectric layer 140. For example, an upper outer wall OS1 of the first barrier pattern 220 may be exposed from the second interlayer dielectric layer 140, and an upper outer wall OS2 of the second barrier pattern 320 may be exposed from the second interlayer dielectric layer 140. The top surface of the second interlayer dielectric layer 140 may be located at a lower level than that of a top surface of each of the gate contact plug GCP and the source/drain contact plug SCP. The first and second metal plugs 210 and 310 and the first and second barrier patterns 220 and 320 may have their top surfaces at the same level. The second interlayer dielectric layer 140 may be etched using an etch recipe that has an etch selectivity with respect to the first and second metal plugs 210 and 310 and the first and second barrier patterns 220 and 320. The second interlayer dielectric layer 140 may be etched by, for example, a wet etching process or a dry etching process.

Figure 12A:
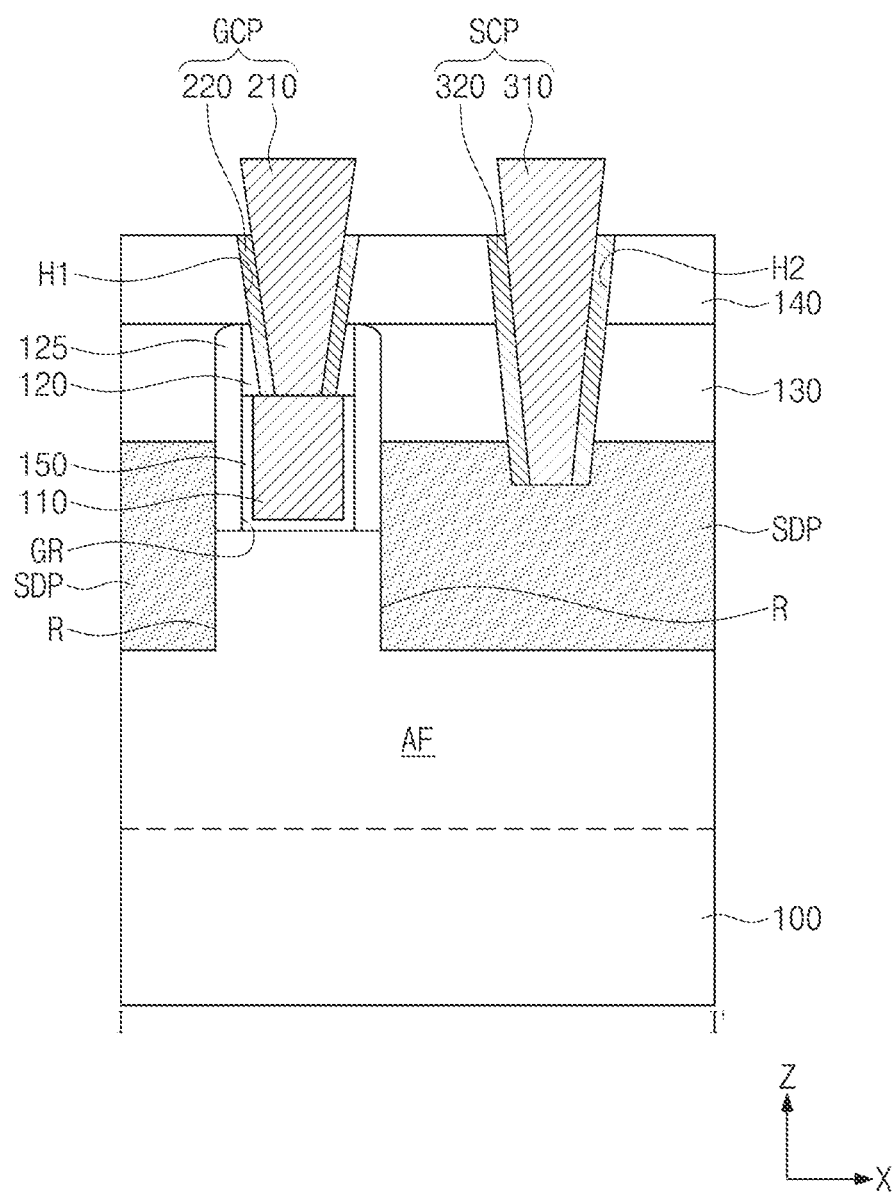
Figure 12B:
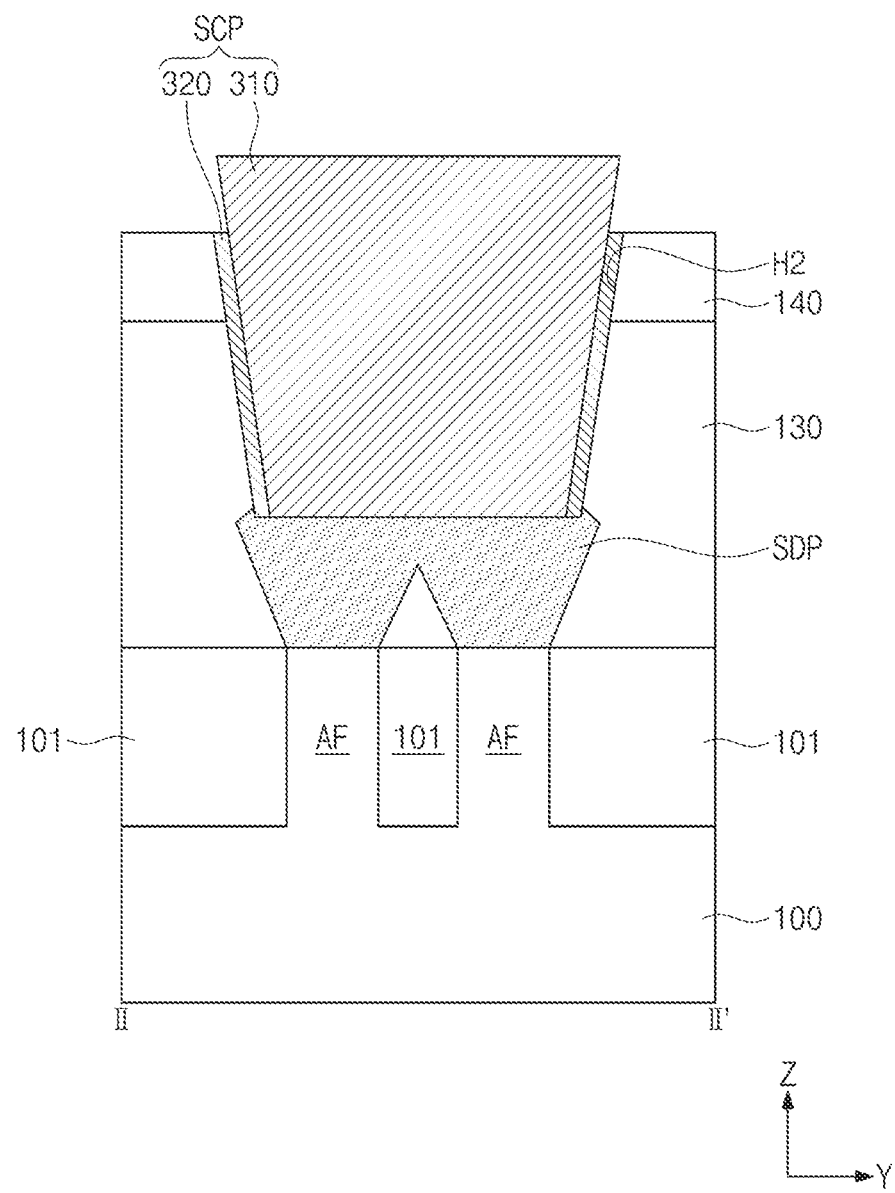
Figure 12C:
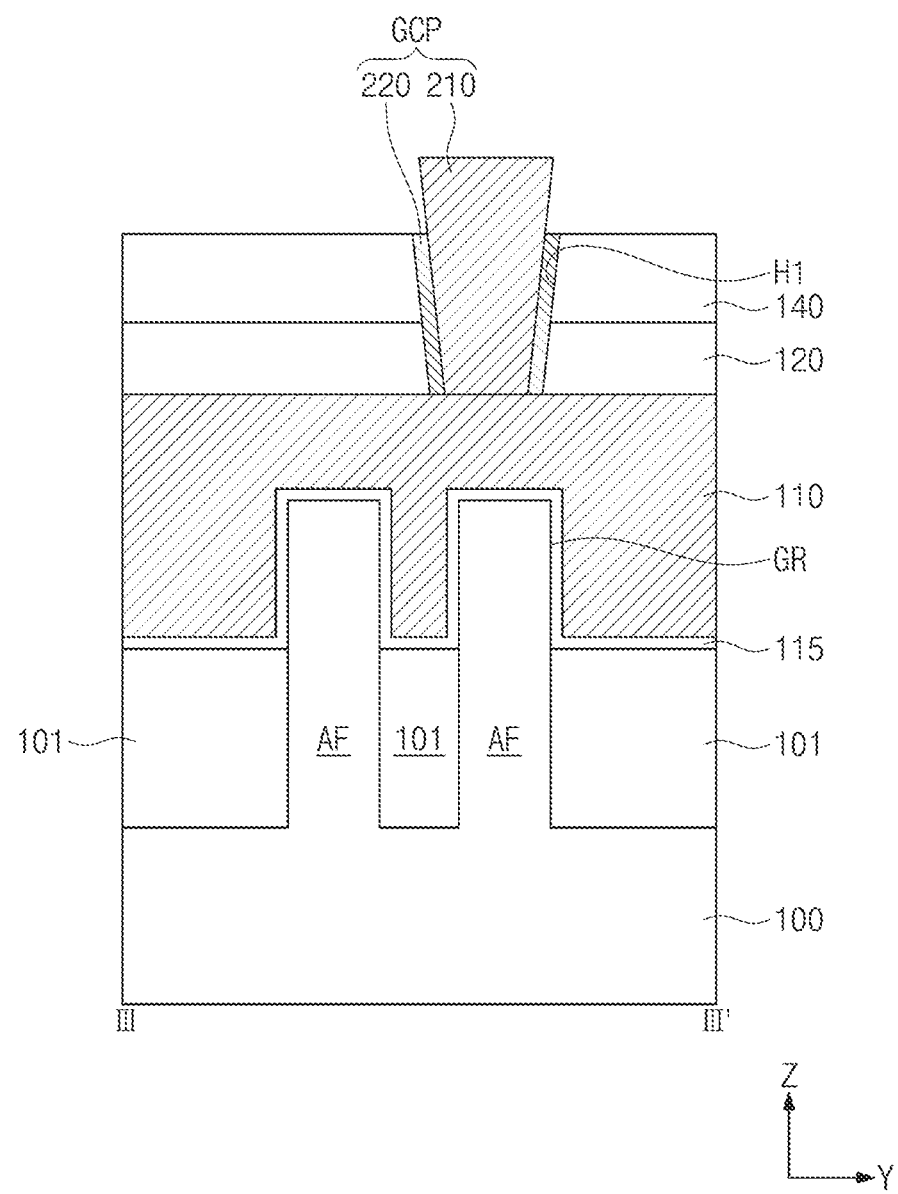

Referring to FIGS. 12A, 12B, and 12C, an etching process may be performed such that the first and second barrier patterns 220 and 320 may be removed on their portions exposed by the second interlayer dielectric layer 140. Thus, the first and second metal plugs 210 and 310 may be partially exposed on their sidewalls. The top surface of the first barrier pattern 220 may be located at a lower level than that of the top surfaces of the first and second metal plugs 210 and 310, and at substantially the same level as that of the top surface of the second interlayer dielectric layer 140. The top surface of the second barrier pattern 320 may be located at a lower level than that of the top surfaces of the first and second metal plugs 210 and 310, and at substantially the same level as that of the top surface of the second interlayer dielectric layer 140. The etching process may use an etch recipe having an etch selectivity with respect to the second interlayer dielectric layer 140 and the first and second metal plugs 210 and 310. The etching process may be, for example, a wet etching process or a dry etching process.

Referring back to FIGS. 2A, 2B, and 2C, a third interlayer dielectric layer 150 may be formed on the second interlayer dielectric layer 140. The formation of the third interlayer dielectric layer 150 may include forming a dielectric layer to cover the top surface of the second interlayer dielectric layer 140 and to cover the upper sidewalls and the top surfaces of the first and second metal plugs 210 and 310 exposed by the second interlayer dielectric layer 140, and then performing a planarization process on the dielectric layer until the top surfaces of the first and second metal plugs 210 and 310 are exposed.

Figure 13A:
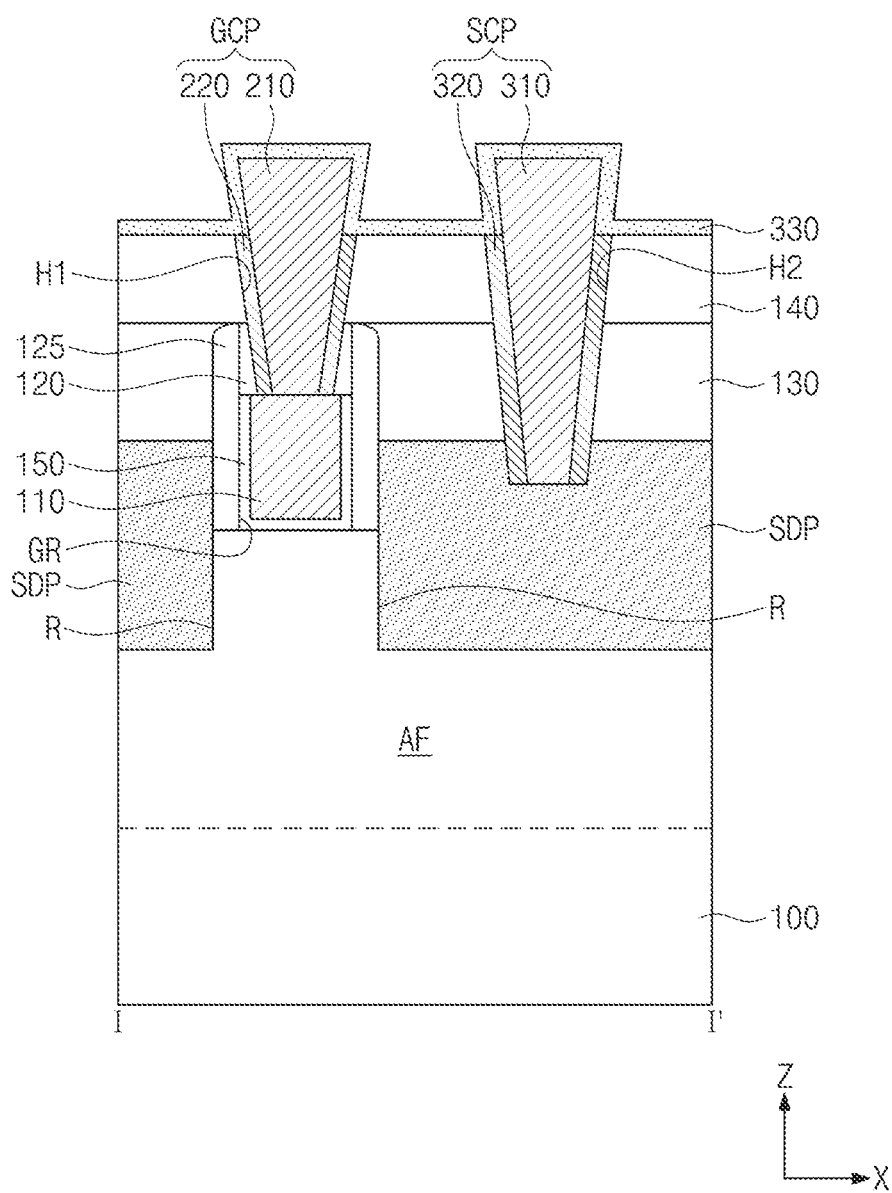
FIGS. 13A to 13C illustrate cross-sectional views respectively taken along lines I-I', II-II', and III-III' of FIG. 1, showing a method of fabricating a semiconductor device according to some example embodiments of the present inventive concepts.
Figure 13B:
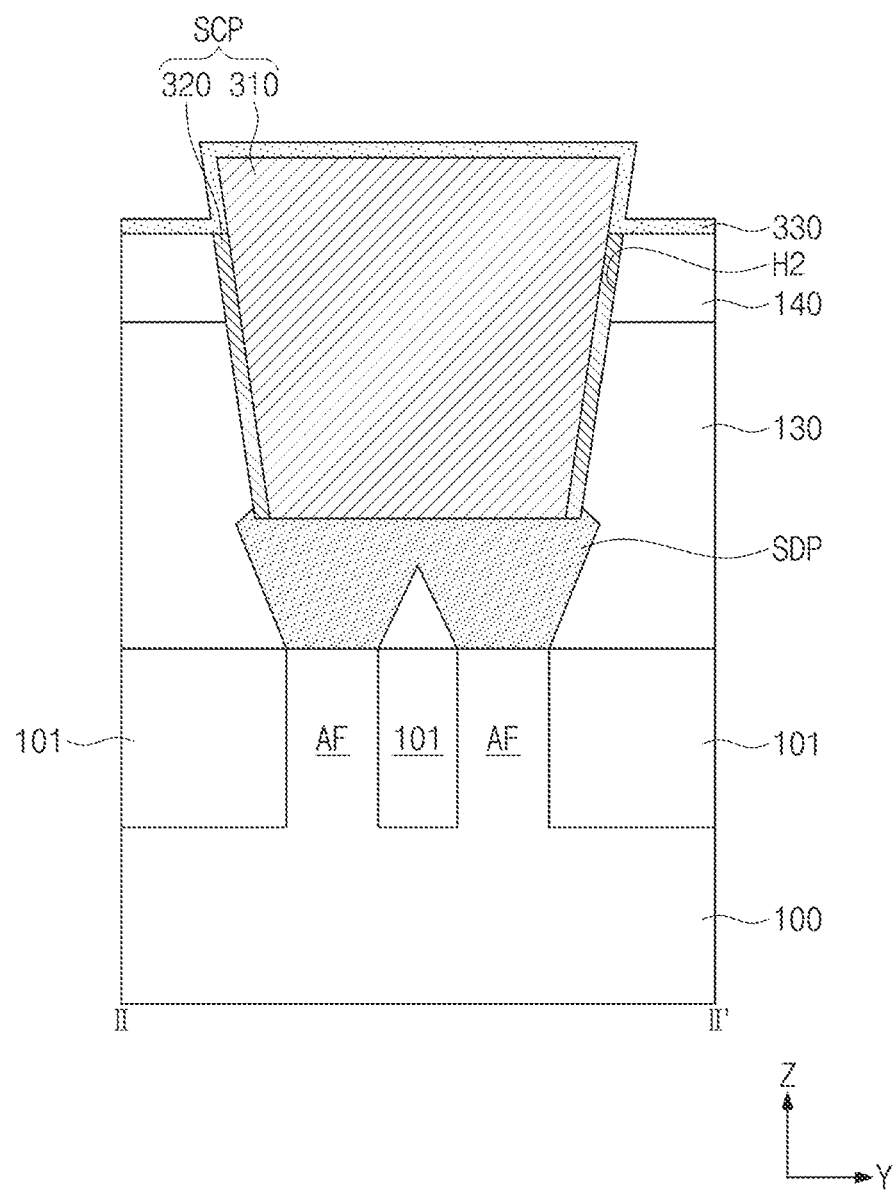
Figure 13C:
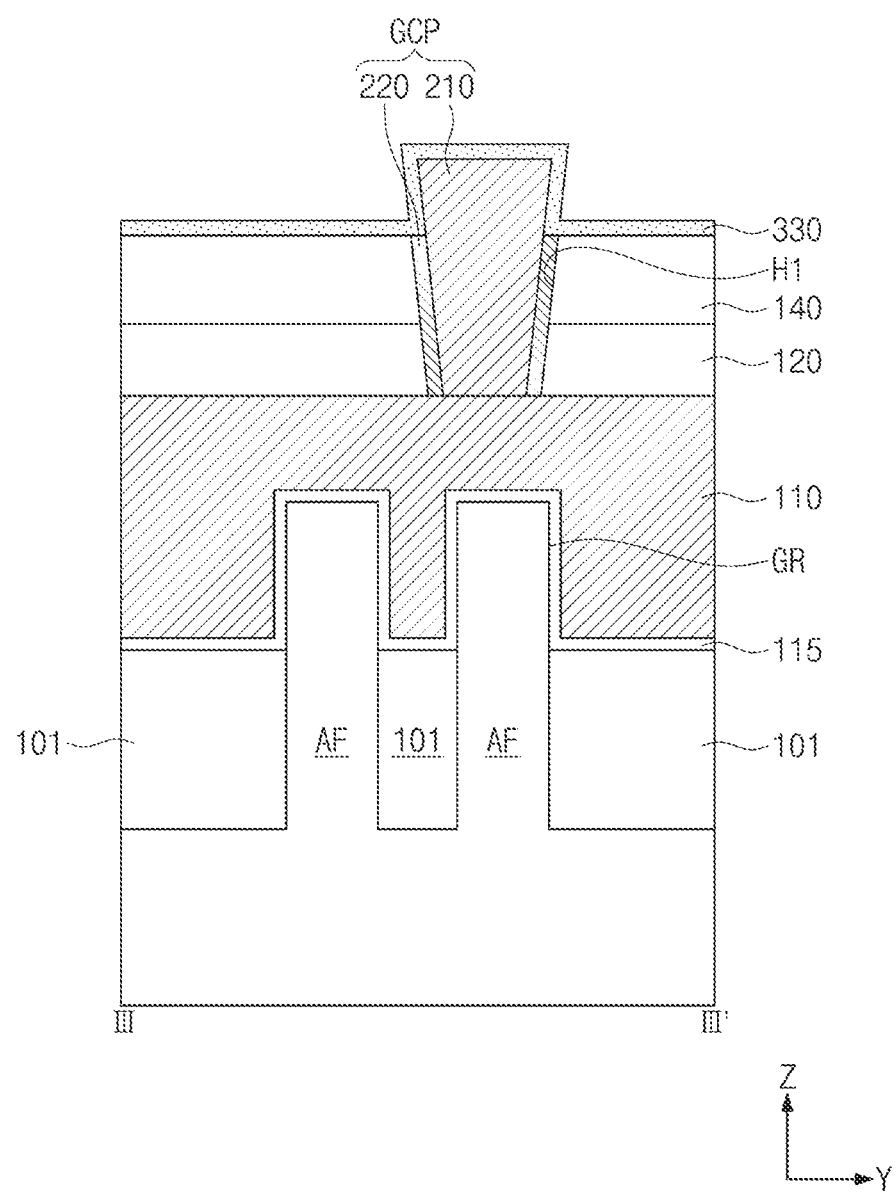

FIGS. 13A to 13C illustrate cross-sectional views respectively taken along lines I-I', and III-III' of FIG. 1, showing a method of fabricating a semiconductor device according to some example embodiments of the present inventive concepts.

Referring back to FIGS. 13A, 13B, and 13C, a barrier dielectric layer 330 may be formed on the second interlayer dielectric layer 140. The barrier dielectric layer 330 may conformally cover the top surface of the second interlayer dielectric layer 140, the top surface of the first metal plug 210, the upper sidewall of the first metal plug 210 exposed by the first barrier pattern 220, the top surface of the first barrier pattern 220, the top surface of the second metal plug 310, the upper sidewall of the second metal plug 310 exposed by the second barrier pattern 320, and the top surface of the second barrier pattern 320. The barrier dielectric layer 330 may include, for example, a silicon nitride layer.

Referring back to FIGS. 3A, 3B, and 3C, the third interlayer dielectric layer 150 may be formed on the barrier dielectric layer 330. The formation of the third interlayer dielectric layer 150 may include forming a dielectric layer to cover the barrier dielectric layer 330, and then performing a planarization process on the dielectric layer until the top surfaces of the first and second metal plugs 210 and 310 are exposed. The planarization process may partially etch the barrier dielectric layer 330 covering the top surfaces of the first and second metal plugs 210 and 310.

According to some example embodiments of the present inventive concepts, a removal process may be performed on a metal barrier pattern on an upper sidewall of a metal plug connected to a gate electrode and on a metal barrier pattern on an upper sidewall of a metal plug connected to a source/drain pattern, which may result in an increase in spacing distance between a gate contact plug and a source/drain contact plug. As a result, an electrical short may be avoided between the gate contact plug and the source/drain contact plug.

Although the inventive concepts have been described in connection with some example embodiments illustrated in the accompanying drawings, it will be understood to those skilled in the art that various changes and modifications may be made without departing from the technical scope of the present inventive concepts. It will therefore also be apparent to those skilled in the art that various substitution, modifications, and changes may be thereto without departing from the scope of the following claims.

What is claimed is:
1. A semiconductor device, comprising:
a gate electrode on a substrate;
a source/drain pattern on the substrate spaced apart from the gate electrode; and
a gate contact plug on the gate electrode,
wherein the gate contact plug comprises:
a first gate contact segment comprising a first metal plug and a first barrier pattern on a sidewall of the first metal plug; and
a second gate contact segment that extends in a vertical direction from a top surface of the first gate contact segment, wherein an upper width of the first gate contact segment is greater than a lower width of the second gate contact segment, wherein a top surface and a sidewall of the second gate contact segment and a bottom surface of the first metal plug are free of the first barrier pattern, and wherein the bottom surface of the first metal plug is in contact with a top surface of the gate electrode, wherein the first gate contact segment comprises a lower part of the first metal plug, and the second gate contact segment comprises an upper part of the first metal plug, and wherein the first metal plug has a width that increases as a distance from the gate electrode increases.

2. The semiconductor device of claim 1, wherein:
the second gate contact segment has a width that increases as a distance from the gate electrode increases, and
the first gate contact segment has a width that increases as a distance from the gate electrode increases.

3. The semiconductor device of claim 1, wherein:
a sidewall of the lower part of the first metal plug is covered with the first barrier pattern, and
the upper part of the first metal plug is free of the first barrier pattern.

4. The semiconductor device of claim 1,
wherein the first barrier pattern contacts the gate electrode.

5. The semiconductor device of claim 1, further comprising a source/drain contact plug on the source/drain pattern, wherein the source/drain contact plug comprises:
a first source/drain contact segment; and
a second source/drain contact segment that extends in the vertical direction from a top surface of the first source/drain contact segment, and
wherein an upper width of the first source/drain contact segment is greater than a lower width of the second source/drain contact segment.

6. The semiconductor device of claim 1, wherein the top surface of the first gate contact segment is at least partially exposed by the second gate contact segment.

7. The semiconductor device of claim 1, further comprising a barrier dielectric layer on a sidewall of the second gate contact segment and the top surface of the first gate contact segment,
wherein a sidewall of the first gate contact segment is free of the barrier dielectric layer.

8. The semiconductor device of claim 7, wherein the barrier dielectric layer comprises a silicon nitride layer.

9. A semiconductor device, comprising:
a gate electrode on a substrate;
a source/drain pattern on the substrate spaced apart from the gate electrode;
a source/drain contact plug on the source/drain pattern; and
a gate contact plug on the gate electrode,
wherein the gate contact plug comprises:
a first metal plug on the gate electrode; and
a first barrier pattern that surrounds a portion of a sidewall of the first metal plug, and wherein:
the first metal plug comprises a first upper part exposed by the first barrier pattern and a first lower part covered with the first barrier pattern,
when viewed in cross-section, the first barrier pattern comprises a first part on a first sidewall of the first lower part of the first metal plug and a second part on a second sidewall of the first lower part of the first metal plug, the second sidewall facing the first sidewall,
when viewed in cross-section, a maximum width of the first lower part and a maximum spacing distance between the first and second parts of the first barrier pattern are equal,
a bottom surface of the first lower part of the first metal plug is free of the first barrier pattern,
the bottom surface of the first lower part of the first metal plug is in contact with a top surface of the gate electrode, and
a bottom surface of the source/drain contact plug is lower than the bottom surface of the first lower part of the first metal plug and a top surface of the source/drain pattern.

10. The semiconductor device of claim 9,
wherein the source/drain contact plug comprises:
a second metal plug on the source/drain pattern; and
a second barrier pattern that surrounds a portion of a sidewall of the second metal plug,
wherein the second metal plug comprises a second upper part free of the second barrier pattern and a second lower part covered with the second barrier pattern.

11. The semiconductor device of claim 10, wherein, when viewed in cross-section, the second barrier pattern comprises a third part on a third sidewall of the second lower part of the second metal plug and a fourth part on a fourth sidewall of the second lower part of the second metal plug,
wherein a maximum width of the second lower part and a maximum spacing distance between the third and fourth parts of the second barrier pattern are equal.

12. The semiconductor device of claim 10, wherein:
a top surface of the first metal plug is located at a same level as a level of a top surface of the second metal plug, and
a top surface of the first barrier pattern is located at a same level as a level of a top surface of the second barrier pattern.

13. The semiconductor device of claim 10, wherein a thickness of the first upper part is equal to a thickness of the second upper part.

14. The semiconductor device of claim 9, wherein a bottom surface of the first barrier pattern contacts the gate electrode.

15. The semiconductor device of claim 9,
wherein the source/drain contact plug comprises:
a second metal plug on the source/drain pattern; and
a second barrier pattern that surrounds a sidewall of the second metal plug,
wherein, when viewed in a plan view, the gate contact plug and the source/drain contact plug horizontally overlap with each other.

16. The semiconductor device of claim 9, further comprising:
an interlayer dielectric layer on a sidewall of the first barrier pattern; and
a barrier dielectric layer on a sidewall of the first upper part of the first metal plug,
wherein the interlayer dielectric layer and the barrier dielectric layer comprise different dielectric materials from each other.

17. A semiconductor device, comprising:
an active fin that protrudes vertically from a top surface of a substrate;
a gate pattern extending across the active fin;

a source/drain pattern on the substrate and spaced apart from the gate pattern; and a gate contact plug on the gate pattern, wherein the gate contact plug comprises:

a first gate contact segment comprising a first metal plug and a first barrier pattern on a sidewall of the first metal plug; and a second gate contact segment that extends vertically from a top surface of the first gate contact segment, wherein an upper width of the first gate contact segment is greater than a lower width of the second gate contact segment, wherein a top surface and a sidewall of the second gate contact segment and a bottom surface of the first metal plug are free of the first barrier pattern, and wherein the bottom surface of the first metal plug is in contact with a top surface of the gate pattern, the semiconductor device further comprising a source/drain contact plug on the source/drain pattern, wherein the source/drain contact plug comprises:

a first source/drain contact segment comprising a second metal plug and a second barrier pattern on a sidewall of the second metal plug; and a second source/drain contact segment that extends vertically from a top surface of the first source/drain contact segment, wherein an upper width of the first source/drain contact segment is greater than a lower width of the second source/drain contact segment, and wherein a top surface and a sidewall of the second source/drain contact segment and a bottom surface of the second metal plug are free of the second barrier pattern.

18. The semiconductor device of claim 17, wherein, when viewed in a plan view, the source/drain contact plug and the gate contact plug horizontally overlap with each other.

* * * * *